(12) United States Patent
Kosaka et al.

(10) Patent No.: US 8,717,486 B2
(45) Date of Patent: May 6, 2014

(54) IMAGING UNIT AND IMAGING DEVICE

(75) Inventors: Akira Kosaka, Yao (JP); Yasutaka Tanimura, Nara (JP); Takashi Matsuo, Suita (JP); Natsuki Yamamoto, Kawasaki (JP)

(73) Assignee: Konica Minolta Holdings, Inc., Tokyo (JP)

( * ) Notice: Subject to any disclaimer, the term of this patent is extended or adjusted under 35 U.S.C. 154(b) by 421 days.

(21) Appl. No.: 13/121,816

(22) PCT Filed: Sep. 24, 2009

(86) PCT No.: PCT/JP2009/066474
§ 371 (c)(1),
(2), (4) Date: Mar. 30, 2011

(87) PCT Pub. No.: WO2010/038640
PCT Pub. Date: Apr. 8, 2010

(65) Prior Publication Data
US 2011/0199530 A1    Aug. 18, 2011

(30) Foreign Application Priority Data

Oct. 1, 2008   (JP) ................. 2008-256556

(51) Int. Cl.
*H04N 5/225* (2006.01)
*H01L 23/12* (2006.01)
(52) U.S. Cl.
USPC ........................................ 348/340; 257/700
(58) Field of Classification Search
USPC ............... 348/208.11, 294, 333.08, 335, 340; 257/700
See application file for complete search history.

(56) References Cited

U.S. PATENT DOCUMENTS

| | | | |
|---|---|---|---|
| 7,728,398 B2 | 6/2010 | Nakajo et al. | 257/432 |
| 2002/0057631 A1* | 5/2002 | Raymond et al. | 369/44.19 |
| 2003/0043289 A1 | 3/2003 | Konno | 348/335 |
| 2004/0169763 A1 | 9/2004 | Ikeda | 348/340 |
| 2007/0280668 A1 | 12/2007 | Kubo et al. | 396/133 |
| 2008/0017942 A1 | 1/2008 | Kosaka et al. | 257/432 |
| 2009/0040361 A1* | 2/2009 | Heim et al. | 348/340 |
| 2009/0128604 A1* | 5/2009 | Silverbrook | 347/47 |
| 2009/0128684 A1* | 5/2009 | Apel | 348/360 |

FOREIGN PATENT DOCUMENTS

| | | |
|---|---|---|
| JP | 2002-357773 A | 12/2002 |
| JP | 2004-200965 | 7/2004 |
| JP | 2006-246656 A | 9/2006 |

(Continued)

OTHER PUBLICATIONS

Extended European Search Report issued on Feb. 15, 2012 in European Application No. 09 81 7674.

*Primary Examiner* — Trung Diep
(74) *Attorney, Agent, or Firm* — Cozen O'Connor

(57) ABSTRACT

A technique of enabling both of higher functionality and higher accuracy in a compact optical system is provided. To achieve this object, an imaging unit has a laminated structure formed by laminating a plurality of layers including: an image capturing element layer including an image capturing element part; a lens layer capable of changing a distance from the image capturing element layer; and an actuator layer including a movable part for moving the lens layer; and a signal transmitter disposed so as to connect the actuator layer and the image capturing element layer, and transmitting a drive signal for driving the movable part from the image capturing element layer side to the actuator layer, and the movable part is deformed according to the drive signal transmitted through the signal transmitter, and the actuator layer is provided between the image capturing element layer and the lens layer.

12 Claims, 21 Drawing Sheets

(56) References Cited

FOREIGN PATENT DOCUMENTS

| JP | 2007-012995 A | 1/2007 |
|---|---|---|
| JP | 2007-043628 A | 2/2007 |
| JP | 2007-193248 A | 8/2007 |
| JP | 2008-020812 A | 1/2008 |
| JP | 2008-048388 A | 2/2008 |
| WO | WO 2006/087408 | 8/2006 |
| WO | WO 2010/038640 A1 | 4/2010 |

* cited by examiner

F I G. 3
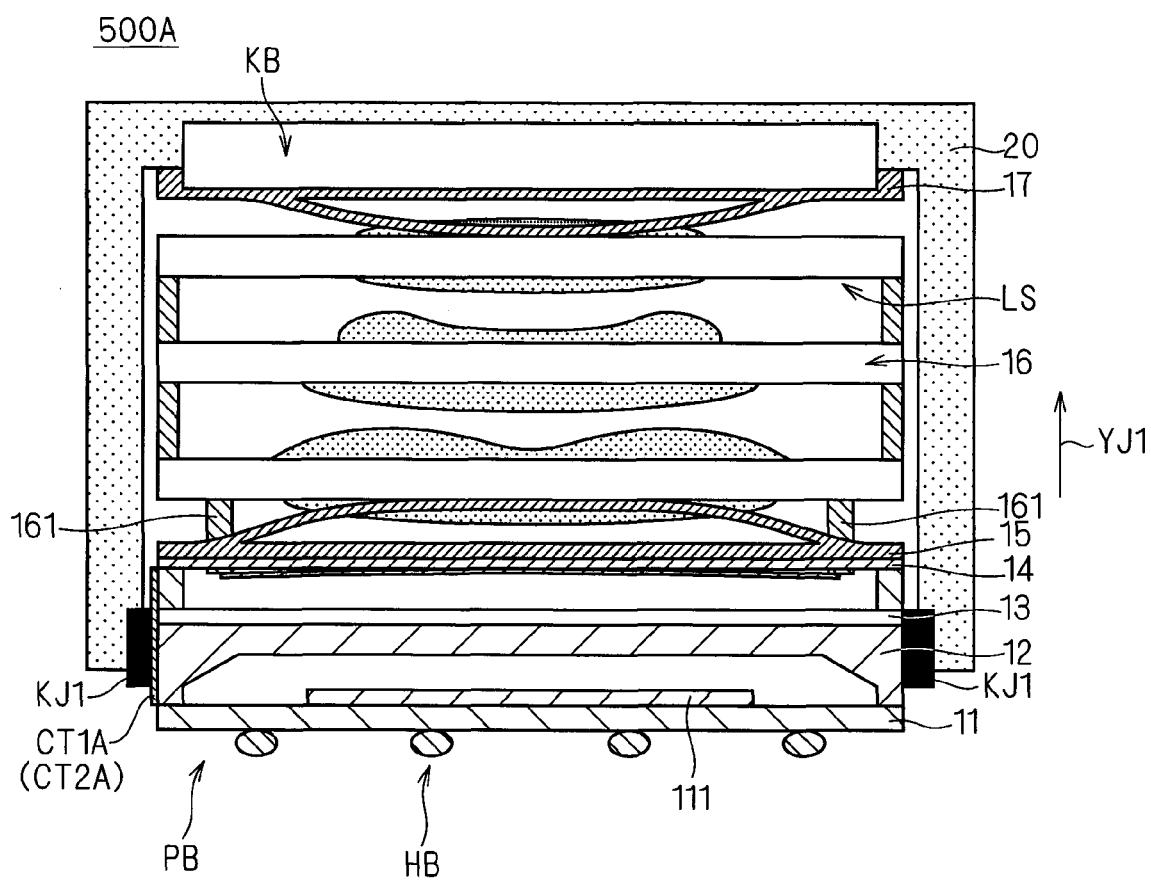

F I G. 7
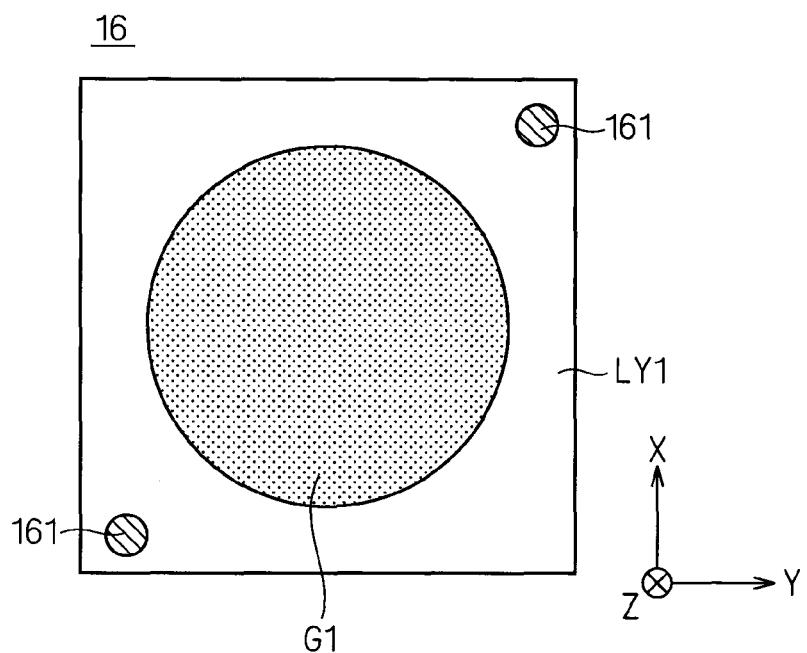
F I G. 8
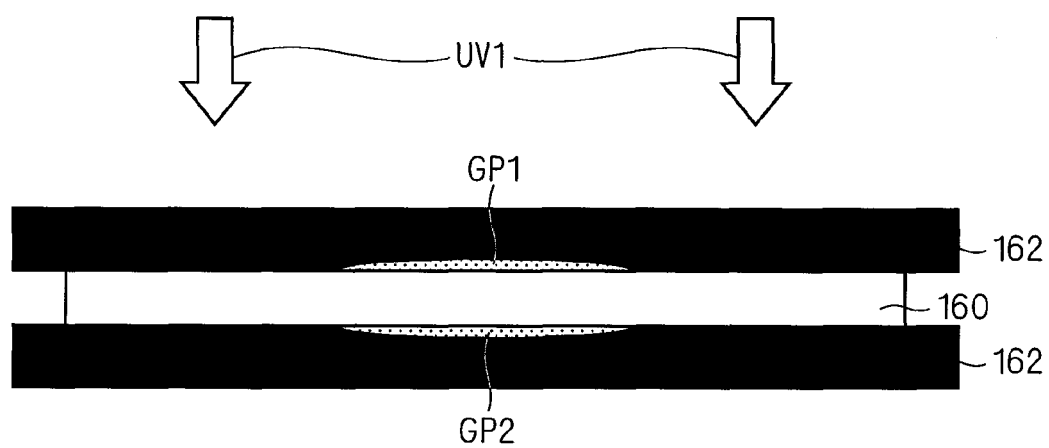

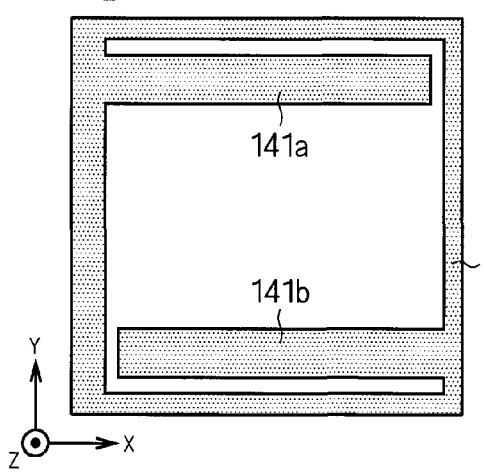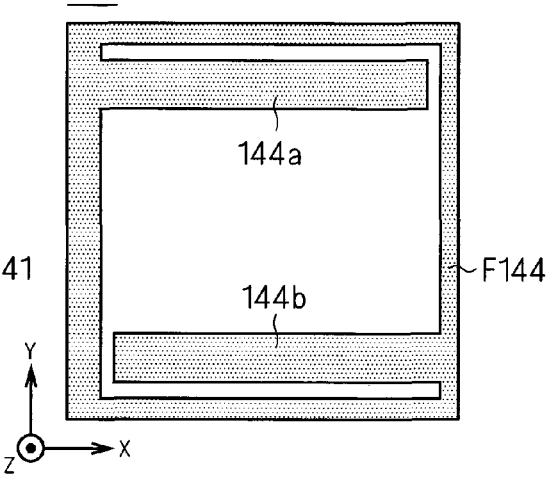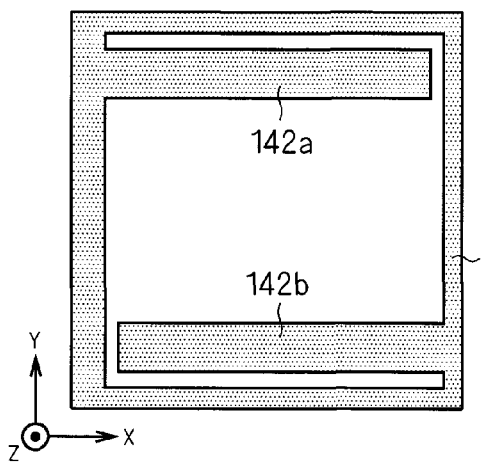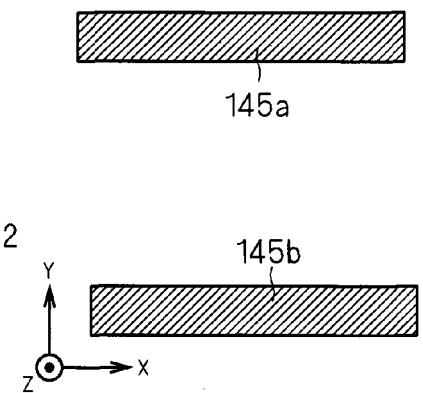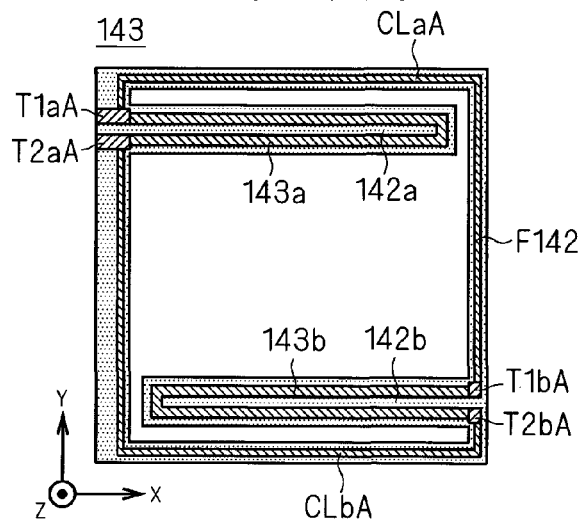

F I G. 1 7
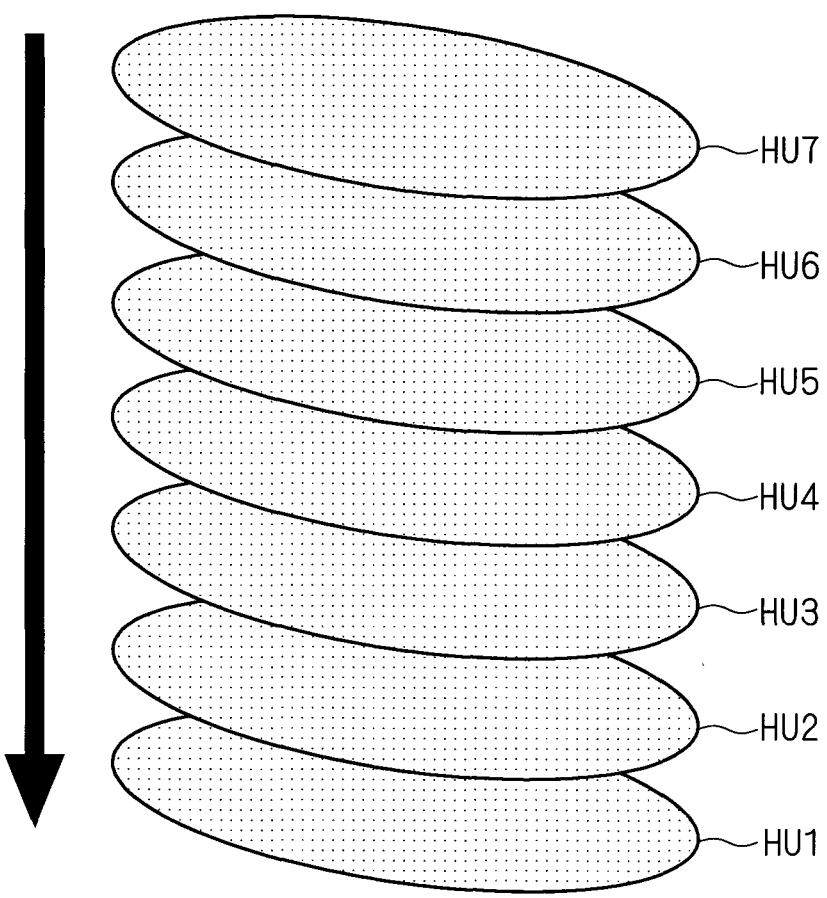

F I G. 25A
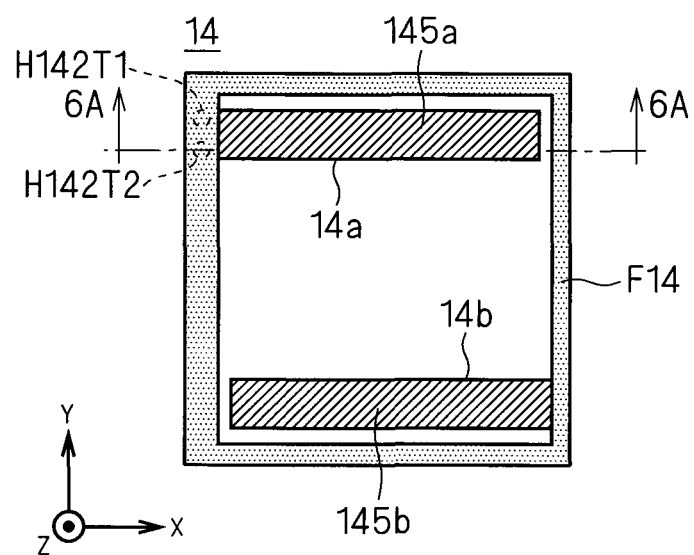
F I G. 25B
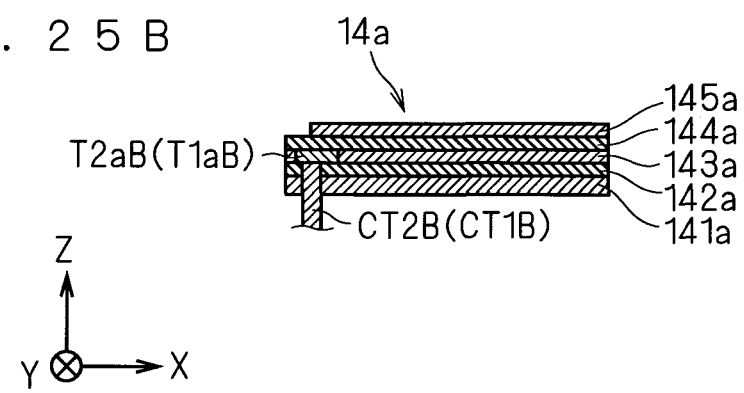

IMAGING UNIT AND IMAGING DEVICE

RELATED APPLICATIONS

This application is a U.S. National Stage Application under 35 U.S.C. 371 of International Application No. PCT/JP2009/066474, filed with Japanese Patent Office on Sep. 24, 2009, which claims priority to Japanese Patent Application No. 2008-256558, filed Oct. 1, 2008.

TECHNICAL FIELD

The present invention relates to a compact imaging unit and an imaging device.

BACKGROUND ART

Recently, a camera module is generally installed on a compact electronic device such as a mobile telephone, and the camera module has been demanded to be made smaller.

Conventionally, this camera module requires, for example, a lens barrel and a lens holder which support the lens, a holder which supports an infrared (IR) cut filter, a housing that holds a laminated body made up of a substrate, an image capturing element, and an optical element, a resin which seals the laminated body, and the like. Therefore, when the above multiple parts are made smaller, it has not been easy to make a camera module by precisely combining the multiple parts.

Then, a technique is proposed in which a substrate, a semiconductor sheet formed with multiple image capturing elements and a lens array sheet formed with multiple image capturing lenses are attached with resin layers interposed therebetween to form a laminated member, and the laminated member is subjected to dicing, to complete individual camera modules (e.g., Patent Document 1, etc). Further, a technique is also proposed in which an image sensor wafer formed by arranging a plurality of image sensor chips in a matrix state, a lens array formed by integrating a plurality of lenses, an IR filter glass, and a diaphragm film are integrally attached in this order to form a structure and the structure is cut along the boundary of the image sensor chips, to complete individual camera modules (e.g., Patent Document 2, etc).

PRIOR ART DOCUMENTS

Patent Documents

Patent Document 1: Japanese Patent Application Laid-Open No. 2007-12995
Patent Document 2: Japanese Patent Application Laid-Open No. 2004-200965

SUMMARY OF THE INVENTION

Problem to be Solved by the Invention

However, although even a compact camera module has been demanded to have higher functionality of module having various functions such as an auto-focus function and a zoom function, the techniques of above Patent Documents 1 and 2 cannot sufficiently support this demand for higher functionality.

The present invention has been made in view of the above problem, and it is an object of the present invention to provide a technique of enabling both of higher functionality and higher accuracy in a compact optical system.

Means for Solving the Problem

To achieve the above object, an imaging unit according to a first aspect includes a laminated structure formed by laminating a plurality of layers including: an image capturing element layer including an image capturing element part; a lens layer capable of changing a distance from the image capturing element layer; and an actuator layer including a movable part for moving the lens layer; and a signal transmitter disposed so as to connect the actuator layer and the image capturing element layer and transmitting a drive signal for driving the movable part from the image capturing element layer side to the actuator layer. In the imaging unit, the movable part is deformed according to the drive signal transmitted through the signal transmitter, and the actuator layer is provided between the image capturing element layer and the lens layer.

An imaging unit according to a second aspect is the imaging unit according to the first aspect, wherein the laminated structure further includes another lens layer which is arranged on an opposite side of the image capturing element layer with respect to the lens layer, with a fixed distance from the image capturing element part.

An imaging unit according to a third aspect is the imaging unit according to the first aspect, wherein the laminated structure further includes one or more function layers which are provided between the image capturing element layer and the actuator layer, and the signal transmitter penetrates through the function layers.

An imaging unit according to a fourth aspect is the imaging unit according to the first aspect, wherein the laminated structure further includes one or more function layers which are provided between the image capturing element layer and the actuator layer, and the signal transmitter is disposed along outer rims of the function layers.

An imaging unit according to a fifth aspect is the imaging unit according to the first aspect, wherein the movable part includes a film element which is reversibly deformed according to the drive signal, and moves the lens layer by means of deformation of the film element.

An imaging unit according to a sixth aspect is the imaging unit according to the fifth aspect, wherein the movable part includes, as the film element, a thin film of a shape memory alloy attached to a substrate.

An imaging unit according to a seventh aspect is the imaging unit according to the fifth aspect, wherein the movable part includes, as the film element, a thin film of a piezoelectric element attached to a substrate.

An imaging device according to an eighth aspect has an imaging unit. The imaging unit includes a laminated structure formed by laminating a plurality of layers including; an image capturing element layer including an image capturing element part; a lens layer capable of changing a distance from the image capturing element layer; and an actuator layer including a movable part for moving the lens layer; and a signal transmitter disposed so as to connect the actuator layer and the image capturing element layer and transmitting a drive signal for driving the movable part from the image capturing element layer side to the actuator layer, in which the movable part is deformed according to the drive signal transmitted through the signal transmitter, and the actuator layer is provided between the image capturing element layer and the lens layer. The imaging unit receives a supply of the drive signal to drive the lens layer.

Effect of the Invention

The imaging unit according to any of the first to seventh aspects can shorten a signal transmitter which transmits the drive signal to the actuator, so that it is possible to realize a more reliable driving mechanism which achieves higher functionality in a compact imaging unit such as an imaging unit made at a wafer level.

The imaging unit according to the second aspect can improve lens performance in the compact imaging unit while maintaining high reliability.

With the imaging unit according to the third aspect, when imaging units including a compact driving mechanism are manufactured, by providing similar penetrating wiring parts in other sheets which are laminated and bonded to an actuator layer, it is possible to readily and precisely form a signal transmitter for applying an electrical field to a movable part.

With the imaging unit according to the fourth aspect, it is possible to readily make each layer arranged between an image capturing element layer and an actuator layer.

BRIEF DESCRIPTION OF THE DRAWINGS

FIG. 3 is a schematic sectional view of the camera module.

FIG. 7 is a lower surface external view of the lens layer.

FIG. 8 is a view illustrating how a lens constituting layer with a third lens is made.

FIGS. 13A to 13E are views for describing a detailed configuration example of the actuator layer.

FIG. 17 is a view schematically illustrating how prepared sheets are laminated sequentially and bonded.

FIGS. 25A to 25B are schematic sectional views of the actuator layer according to the specific example 2 of the modified example.

MODE FOR CARRYING OUT THE INVENTION

Embodiment

Figure 1:
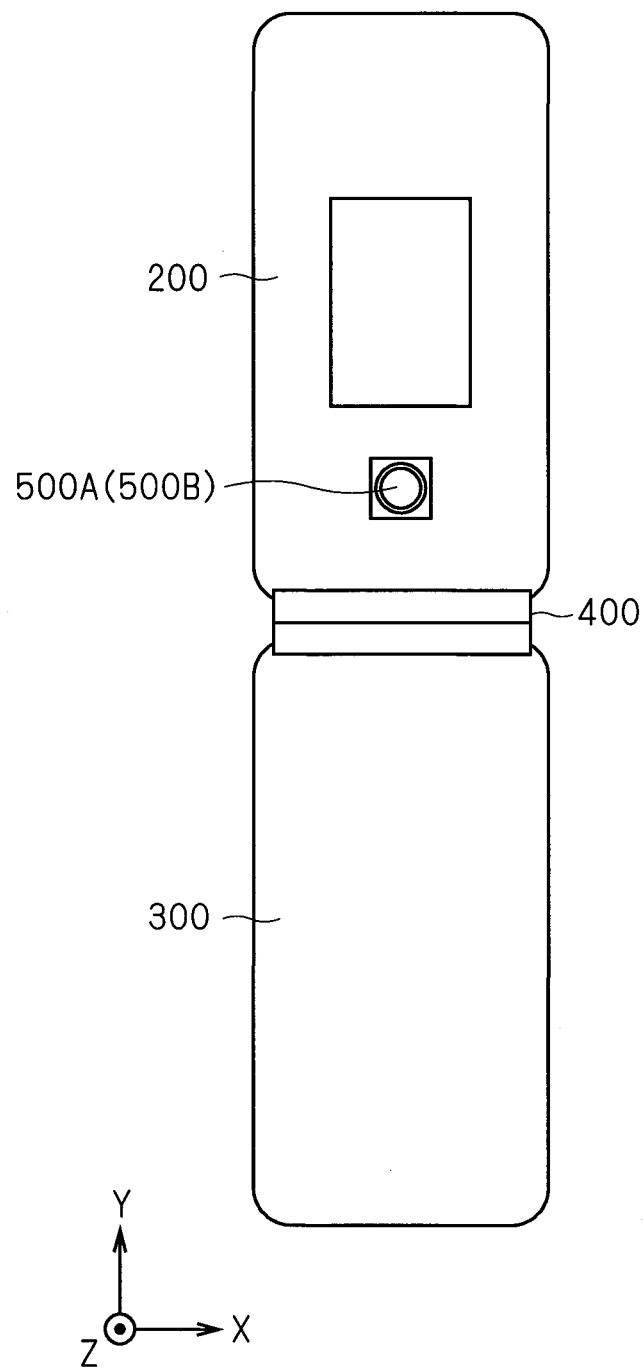
FIG. 1 is a schematic view illustrating a schematic configuration of a mobile telephone on which a camera module according to an embodiment is installed.

FIG. 1 is a schematic view illustrating a schematic configuration of a mobile telephone 100 on which a camera module 500A according to an embodiment of the present invention is installed. Note that, FIG. 1 and subsequent figures are adequately assigned three X, Y and Z axes orthogonal to each other to clarify an azimuth relationship.

As illustrated in FIG. 1, the mobile telephone 100 is formed as a folding mobile telephone, and has a first housing 200, a second housing 300 and a hinge part 400.

The first housing 200 and the second housing 300 are each a plate rectangular parallelepiped, and function as housings which accommodate various electronic members. More specifically, the first housing 200 has a camera module 500A and a variable display (not illustrated), and the second housing 300 has a controller which electrically controls the mobile telephone 100 and an operating member (not illustrated) such as buttons.

The hinge part 400 pivotally connects the first housing 200 and the second housing 300. By this means, the mobile telephone 100 is made foldable.

Figure 2:
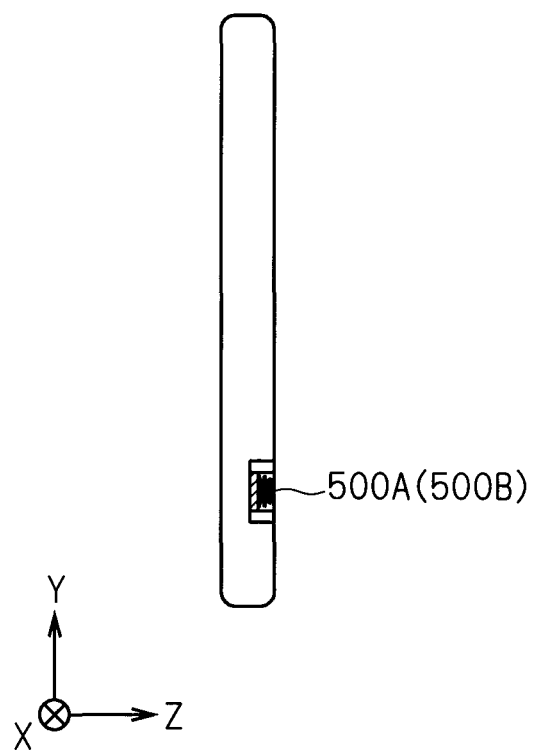
FIG. 2 is a schematic sectional view focusing on a first housing of the mobile telephone.

FIG. 2 is a schematic sectional view focusing on the first housing 200 of the mobile telephone 100.

As illustrated in FIG. 1 and FIG. 2, the camera module 500A is a compact imaging device, that is, a micro camera unit (MCU), having a size of about 5 square mm in an X-Y cross section and a thickness (depth in the Z direction) of the order of about 3 mm.

The configuration of the camera module 500A and its manufacturing steps will be described below in order.

<Camera Module Configuration>

FIG. 3 is a schematic sectional view of the camera module 500A where a direction indicated by an arrow YJ1 is a +Z direction.

As illustrated in FIG. 3, the camera module 500A has a driving mechanism KB which drives a lens 16 of a phototaking optical system and an image capturer PB which acquires an image captured from an object image.

The image capturer PB has a configuration in which, for example, an image capturing element layer 11 which has an image capturing element 111 such as a COMS sensor or a CCD sensor, an image capturing element holder layer 12, and an infrared (IR) cut filter layer 13 are laminated in this order.

In space covered by the image capturer PB and a cover 20 which allows incidence of light from a ceiling surface by, for example, adopting a structure having an opening part in the ceiling surface, are stored a lens layer 16, a first parallel spring (lower layer parallel spring) 15 and a second parallel spring (upper layer parallel spring) 17 which hold the lens layer 16, and a actuator layer (driving layer) 14 which functions as a driver, all of which are made in a wafer state (at a wafer level). The respective function layers stored in this space form the driving mechanism KB which drives the lens layer 18 in cooperation with each other.

More specifically, in the camera module 500A, the cover 20 and the image capturer PB serve as a fixing part with respect to the lens layer 16.

Further, the lens layer 16 is supported by the first parallel spring 15 and the second parallel spring 17 bonded to the fixing part. More specifically, the first parallel spring 15 is interposed between the image capturer PB and the lens layer 16 on the one principal plane side (−Z side) of the lens layer 16, and the second parallel spring 17 is interposed between the cover 20 and lens layer 16 on the other principal plane side (+Z side) of the lens layer 16.

In a non-driven state (for example, a still state before driving), the first parallel spring 15 and the second parallel spring 17 are each elastically deformed, and the lens layer 16 rests in a position where the elastic force of the first parallel spring 15 and the elastic force of the second parallel spring 17 balance out.

The actuator layer 14 has an actuator which produces driving displacement in the direction (+Z direction) from the one principal plane side of the lens layer 16 to the other principal plane side, and is arranged on one principal plane side (the lower surface side in the illustrated example) of the lens layer 16 (more specifically, each of lens G1 to G3 of FIG. 6 forming the lens layer 16) and on the other principal plane side (upper surface side in the illustrated example of FIG. 3) of the image capturing element layer 11. That is, the actuator layer 14 is interposed between the image capturing element layer 11 and the lens layer 16, and there is no lens element between the actuator layer 14 and the image capturing element layer 11. The actuator contacts projecting parts 161 projecting toward the one principal plane side of the lens layer 16, and driving displacement produced in the actuator is transmitted to the lens layer 16 through the projecting parts 161. An outer rim wiring part CT1A (CT2A) is disposed from the image capturing element layer 11 to the actuator layer 14 along the outer rims of the image capturing element holder layer 12 and the infrared (IR) cut filter layer 13, and functions as a signal transmitter which transmits a drive signal for driving the actuator, from a predetermined electrode pad provided in the image capturing element layer 11 which holds the image capturing element layer 11 to the actuator layer 14.

As described above, the camera module 500A has a laminated structure LS laminating a plurality of layers 11, 12, 13, 14, 15, 16 and 17, and the lens layer 16 which is a driven body is bonded to elastic members arranged in positions to oppose each other across the lens layer 16 and the elastic members hold the lens layer 16 in a state of being elastically deformed toward each other in a direction vertical to the lens layer 16 (vertical direction of the lens layer 16). Then, the lens layer 16 receives the driving force from the actuator of the actuator layer 14 interposed between the image capturing element layer 11 and the lens layer 16, and is displaced from its position.

For example, compared to a configuration of displacing the lens layer 16 by arranging the actuator layer 14 on the opposite side of the image capturing element layer 11 with respect to the lens layer 16, the actuator layer 14 is configured to be interposed between the image capturing element layer 11 and the lens layer 16, so that the length of the signal transmitter becomes shorter. When the length of the signal transmitter becomes short, the number of layers in which signal transmitters are disposed can be decreased, so that it is possible to improve reliability of the driving mechanism in a compact imaging device which is made as a laminated structure at a wafer level.

Thus, the driving mechanism KB provided in the camera module 500A can displace the lens layer 16 made at a wafer level, in the optical axis direction of the lens layer 16, and makes the camera module 500A function as an imaging device having the lens driving function.

<Regarding Each Function Layer>

The details of the respective function layers forming the laminated structure LS of the camera module 500A will be described below. Note that, with each function layer, the surface on the −Z direction side is referred to as "one principal plane side", and the surface on the +Z direction side is referred to as "the other principal plane side".

Figure 4:
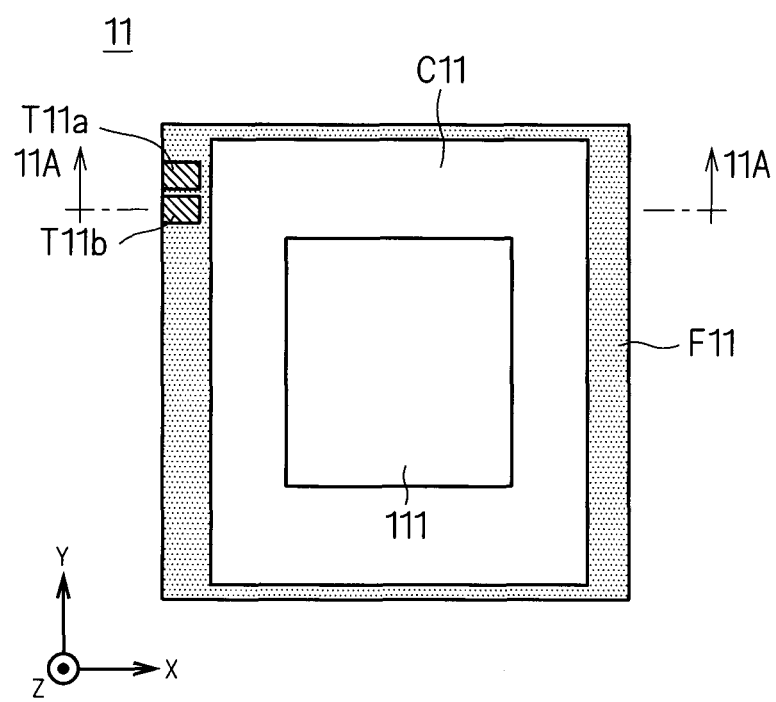
FIG. 4 is a view illustrating an upper surface external view of an image capturing element layer to which an image capturing element is attached.
Figure 5:
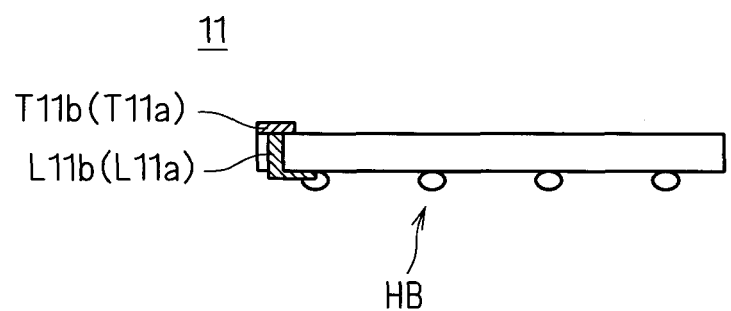
FIG. 5 is a schematic sectional view of the image capturing element layer.

Image Capturing Element Layer 11:

FIG. 4 is a view illustrating an upper surface external view of the image capturing element layer 11 to which the image capturing element 111 is attached, and, further, FIG. 5 is a schematic sectional view of the image capturing element layer 11 seen from a cross-sectional line 11A-11A of FIG. 4.

As illustrated in FIG. 3 and FIG. 4, the image capturing element layer 11 is a member which has the image capturing element 111 which generates an image signal of an object image by receiving light of the object having passed through the photo-taking optical system, its peripheral circuit C11, and an outer peripheral part F11 surrounding the peripheral circuit C11. Note that, on the surface on the one principal plane side of the image capturing element layer 11 (the lower surface side in the illustrated example of FIG. 3), solder balls HB used for soldering according to a reflow scheme are provided.

As illustrated in FIG. 4 and FIG. 5, electrode pads T11a and T11b are formed on the surface on the other principal plane side of the image capturing element layer 11 (the upper surface side in the illustrated example of FIG. 5). The electrode pads T11a and T11b are each electrically connected with outer rim electrodes CT1A and CT2A illustrated in FIG. 3 in the periphery of the image capturing element layer 11.

On the one principal plane side of the electrode pad T11a (the lower surface side in the illustrated example of FIG. 5), penetrating electrodes L11a and L11b penetrating through the image capturing element layer 11 are formed. One end of the penetrating electrode L11a is electrically connected with the electrode pad T11a, and the other end is electrically connected with one solder ball HB provided in the surface on the one principal plane side of the image capturing element layer 11 (lower surface side in the illustrated example of FIG. 5). Further, one end of the penetrating electrode L11b is electrically connected with the electrode pad T11b, and the other end is electrically connected with one of solder balls HB to which the penetrating electrode L11a is not electrically connected.

Here, when the camera module 500A is installed on the mobile telephone 100 as illustrated in FIG. 1 and FIG. 2, the solder balls HB are electrically connected with an electronic circuit inside the mobile telephone 100. The voltage (drive signal) for driving the actuator layer 14 of the camera module 500A is generated inside the mobile telephone 100, and then is supplied to the actuator layer 14 through wirings or electrodes of the penetrating electrodes L11a and L11b and outer rim electrodes CT1A and CT2A of the image capturing element layer 11. Further, although not illustrated, various terminals for connecting wirings for giving signals to the image capturing element 111 and reading signals from the image capturing element 111 are provided on the surface on the other principal plane side of the image capturing element layer 11 (upper surface side in the illustrated example of FIG. 5).

Image Capturing Element Holder Layer 12:

The image capturing element holder layer 12 is a member which is made of, for example, a material such as resin and which holds the image capturing element layer 11 bonded by, for example, an adhesive. An opening is provided at about the center of the image capturing element holder layer 12.

Infrared Cut Filter Layer 13:

The infrared cut filter layer 13 is formed by layering transparent thin films of different refractive indices on a transparent substrate.

More specifically, the infrared cut filter layer 13 is formed by, for example, spattering multiple transparent thin films of different refractive indices on the upper surface of the substrate made of a glass or transparent resin, and controls a waveband of transmitting light by means of the combination of the thickness and refractive index of the thin film. For example, the infrared cut filter layer 13, which blocks light of the waveband of 600 nm or more, is adopted.

Figure 6:
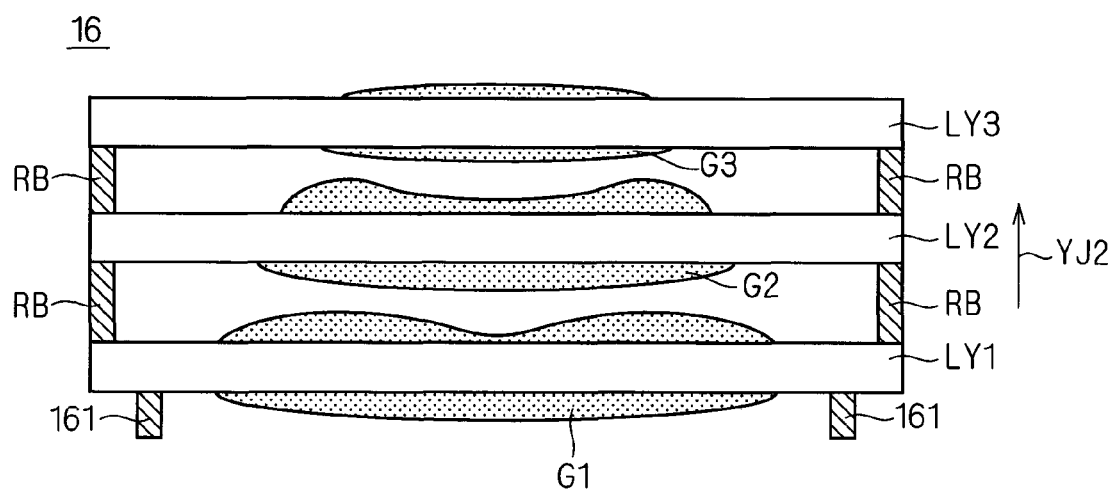
FIG. 6 is a schematic sectional view of a lens layer.

Lens Layer 16:

The lens layer 16 is made at a wafer level using a glass substrate as a base material, and is molded by, for example, overlapping two or more lenses. A case will be illustrated with the present embodiment where the lens layer 16 is formed by overlapping three lenses. FIG. 6 is a schematic sectional view of the lens layer 16 where a direction indicated by an arrow YJ2 is a +Z direction. FIG. 7 is a lower surface external view of the lens layer 16.

As illustrated in FIG. 6, the lens layer 16 has a lens constituting layer LY1 with a first lens G1, a lens constituting layer LY2 with a second lens G2, and a lens constituting layer LY3 with a third lens G3, and the respective lens constituting layers LY1 to LY3 are bonded in this order with ribs RB interposed therebetween.

Further, as illustrated in FIG. 6 and FIG. 7, projecting parts 161 in a non-lens part which does not function as a lens are provided on one principal plane of the lens constituting layer LY1 with the first lens G1.

Each of the lens constituting layers LY1 to LY3 is made according to the same method using the glass substrate 160 as a base material. FIG. 8 is a view illustrating how the lens constituting layer LY3 with the third lens G3 is made.

More specifically, as illustrated in FIG. 8, an acrylic or epoxy ultraviolet (UV) cured resin of high transparency is applied to both surfaces of the glass substrate 160. Then, both surfaces are pressed by transparent lens shaping molds 162 having a shape of each lens (third lens G3 in FIG. 8) at a predetermined pressure and are radiated by ultraviolet rays UV1, so that polymer lenses GP1 and GP2 are each formed on the respective surfaces of the glass substrate 160.

In each of the lens constituting layers LY1 to LY3 made in this way, alignment marks for positioning are formed in two or more predetermined positions. The respective lens constituting layers LY1 to LY3 are built up as the integrated lens layer 16 with rib layers having the ribs RB, between each of the lens constituting layers LY1 to LY3.

More specifically, each of the lens constituting layers LY1 to LY3 and the rib layers are aligned and bonded keeping a substrate shape as is by using a mask aligner and checking respective alignment marks. A bonding method adopts a method of providing a UV cured layer in the rib layer surface to be bonded to each of the lens constituting layers LY1 to LY3 and bonding the layers by the radiation of ultraviolet rays, or a method (surface activated bonding) of radiating a plasma of inert gas on the rib layer surface and attaching and bonding the rib layer surface keeping the rib layer surface activated.

Note that, when a diaphragm is formed in the camera module 500A, a method of applying a shadow mask to the layer with the second lens G2 and then forming a light blocking material thin film, a method of forming a diaphragm layer using, for example, a resin material colored additionally by black, or the like is used.

Figure 9:
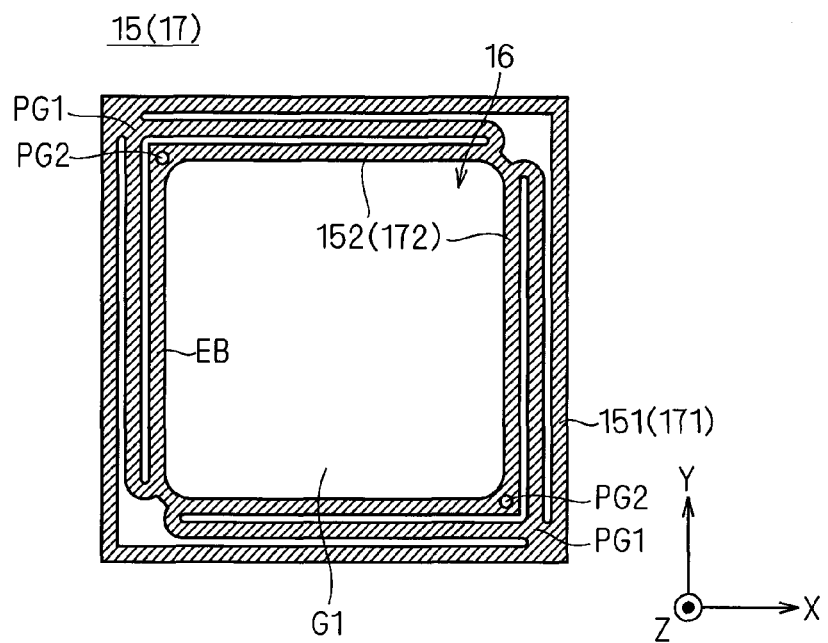
FIG. 9 is an upper surface external view of a first parallel spring.
Figure 10:
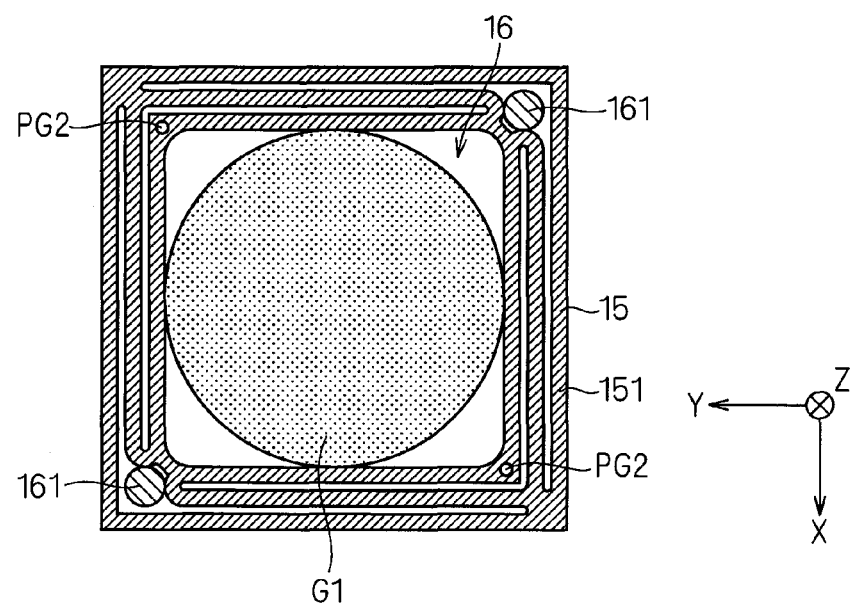
FIG. 10 is a view illustrating the first parallel spring attached to a lens layer.

First Parallel Spring 15:

FIG. 9 is an upper surface external view of the first parallel spring 15. FIG. 10 is a view illustrating the first parallel spring 15 attached to the lens layer 16.

As illustrated in FIG. 9, the first parallel spring 15 is an elastic member which has a fixed frame part 151 and an elastic part 152, and makes a layer (elastic layer) which forms a spring mechanism.

The fixed frame part 151 forms an outer peripheral part of the first parallel spring 15, and bonded to the adjacent actuator layer 14 (more specifically, the frame part F14 (described later) of the actuator layer 14).

The elastic part 152 has a connecting part PG1 with the fixed frame part 151 and a bonding part PG2 to the lens layer 16, and the connecting part PG1 and the bonding part PG2 are connected through a plate member EB.

That is, the first parallel spring 15 is bonded to the adjacent actuator layer 14 in the fixed frame part 151. Further, as illustrated in FIG. 10, the first parallel spring 15 is bonded to the lens layer 16 in the bonding part PG2 provided in the elastic part 152. By this means, when the lens layer 16 is moved in the +Z direction and the fixed frame part 151 bonded to the actuator layer 14 is detached from the lens layer 16, the positions of the connecting part PG1 and the bonding part PG2 are misaligned in the Z direction and the plate member EB is curved causing bending deformation (flexural deformation). Thus, the first parallel spring 15 functions as a spring mechanism in a state where elastic deformation is produced in the plate member EB.

Note that, the first parallel spring 15 is made using, for example, a SUS metal material or a phosphorus bronze. For example, when the first parallel spring 15 is made using a SUS metal material, the shape of the parallel spring is patterned on a metal material using photolithography, is immersed in a ferric chloride etching solution and is subjected to wet etching to form the pattern of the parallel spring.

Figure 11:
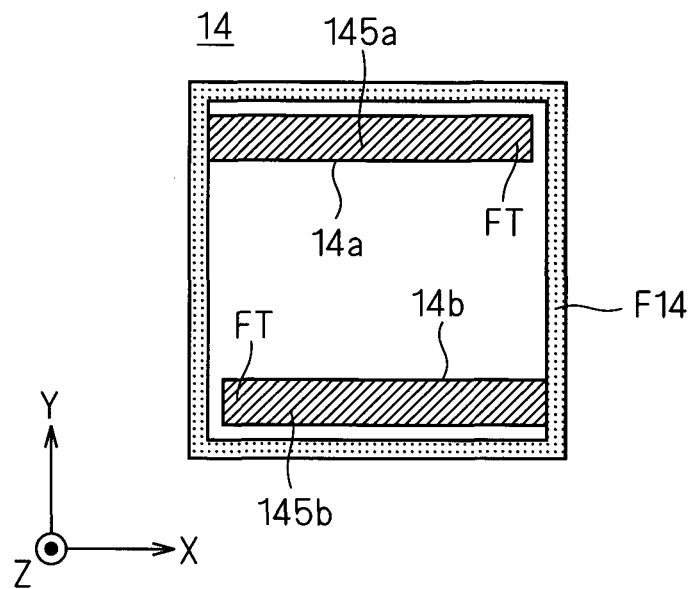
FIG. 11 is a view illustrating an upper surface external view of an actuator layer.
Figure 12:
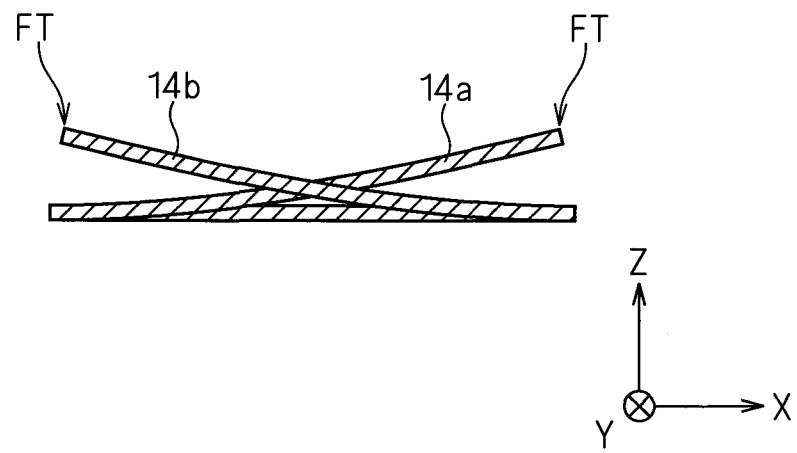
FIG. 12 is a view illustrating a lateral surface external view of the actuator layer.

Actuator Layer 14:

The actuator layer 14 is a thin plate member in which a displacing element (also referred to as "actuator element") which generates the driving force is provided on the substrate such as a metal or silicon (Si). FIG. 11 is a view illustrating an upper surface external view of the actuator layer 14. FIG. 12 is a view illustrating a lateral surface external view of the actuator layer.

More specifically, as illustrated in FIG. 11, the actuator layer 14 has a frame part F14 forming the outer peripheral part and two plate actuators 14a and 14b provided to project from the frame part F14 toward a hollow part inside the frame part F14. Then, thin film displacing elements (actuator elements) 145a and 145b are provided on the other principal plane sides of the actuators 14a and 14b.

For the displacing elements 145a and 145b, for example, a shape memory alloy (SMA) is used. In this case, after forming a first insulation layer such as SiO2, a metal heater layer, a second insulation layer, and a displacing element layer on a substrate using, for example, the spattering method, the actuators part 14a and 14b are set in the mold of a shape which needs to be memorized, and are subjected to heating processing (shape memorizing processing) at a predetermined temperature (for example, 600° C.).

The SMA has characteristics that, when the SMA is heated and reaches a predetermined temperature, the SMA is restored to a predetermined shape memorized in advance (also referred to as "memorized shape"). Here, warped shapes made by free tips FT of the actuators 14a and 14b which are displaced in the +Z direction are memorized. Therefore, when the SMA is heated by conduction of the heater layer, the SMA is contracted and deformed into the memorized shape, and the free tips FT of the actuators 14a and 14b move in the +Z direction (see FIG. 12). That is, the free tip FT sides of the actuators 14a and 14b function as displacement transmission parts.

Here, the detailed configuration and operation of the actuator layer 14 will be described.

FIGS. 13A to 13E are views for describing the detailed configuration of the actuator layer 14.

The actuator layer 14 is formed by laminating a first insulation layer 142 illustrated in FIG. 13B, a heater layer 143 illustrated in FIG. 13C, a second insulation layer 144 illustrated in FIG. 13D, and a displacing element layer 145 illustrated in FIG. 13E in this order on a base layer 141 illustrated in FIG. 13A. Note that, the heater layer 143 illustrated in FIG. 13C is shown by being disposed on the first insulation layer 142 for ease of understanding the relationship between positions of wirings etc.

As illustrated in FIG. 13A, the base layer 141 is made of, for example, a material having adequate rigidity (for example, silicon), and is formed with a plate base member having a frame part F141 and beam parts 141a and 141b.

The frame part F141 is a part bonded and fixed to the infrared cut filter layer 13. The beam part 141a is a plate-like and arm-shaped part provided to project from one predetermined part the frame part F141, and the beam part 141b is a plate-like and arm-shaped part provided to project from the other predetermined part of the frame part F141. The beam parts 141a and 141b are made deformable such that the other end is displaced with the vicinity of one end fixed to the frame part F141 being a fulcrum. Note that, although the frame part F141 and the beam parts 141a and 141b are integrally formed here, the beam parts 141a and 141b are not limited to this and, for example, may be fixed by being fixed to the frame part F141.

That is, with this base layer 141, each one end of the beam parts 141a and 141b are fixed to the frame part F141 to serve as a fixed end, and each other end of the beam parts 141a and 141b serves a free tip, and the frame part F141 is formed to surround the beam parts 141a and 141b.

As illustrated in FIG. 13B, the first insulation layer 142 is made of, for example, a non-conductive material such as a SiO2 thin film of a predetermined thickness formed by, for example, thermal oxidation, across the entire area of the upper surface of the base layer 141 (surface on the +Z side), and has the same shape as the base layer 141. Accordingly, the first insulation layer 142 has a film frame part F142 formed on the upper surface of the frame part F141, and beam parts 142a and 142b formed on the respective upper surfaces of the beam parts 141a and 141b. Here, the frame part F14 of the actuator layer 14 is formed with the frame parts F141, F142 and F144 (FIG. 13D) laminated mainly upward and downward.

As illustrated in FIG. 13C, the heater layer 143 has two thin film resistors 143a and 143b, four electrode parts T1aA, T2aA, T1bA and T2bA and wiring parts CLaA and CLbA.

The thin film resistor 143a is provided on the beam parts 141a and 142a, and is formed with a thin film resistor which generates heat by being applied the voltage. That is, the beam parts 141a and 142a function here as supporting parts which support thin film resistor 143a. Further, the thin film resistor 143b has the same shape as the thin film resistor 143a, and is formed with a thin film resistor which is provided on the beam parts 141b and 142b and which generates heat by being applied the voltage. That is, the beam parts 141b and 142b function here as supporting parts which support the thin film resistor 143b. Then, for example, tantalum nitride (Ta2N) or nichrome (NiCr) is also used for a material of the thin film resistors 143a and 143b. Note that, the thin film resistors 143a and 143b are, for example, formed by spattering, form a photoresist using photolithography and are formed in a predetermined pattern (for example, U-shape) by performing etching of reactive ion etching of thin films formed using this photoresist as an etching mask. Further, a thin film resistor extended thinly in a foil shape is formed by bonding by an adhesive etc or bonding by pressure. Note that, the film forming method may be depositing etc.

Figure 14A:
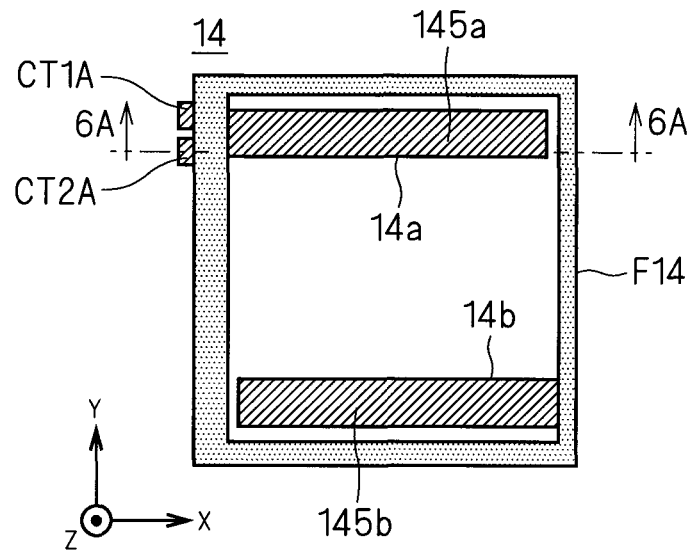
FIGS. 14A to 14C are views for describing an operation example of an actuator.
Figure 14B:
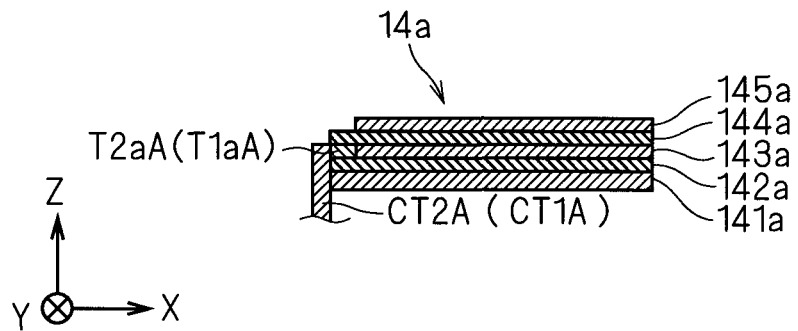

The electrode part T1aA is a part which is made of, for example, a highly conductive metal, which is electrically connected with one end part of the thin film resistor 143a, the outer rim wiring part CT1A illustrated in FIG. 14B and the wiring part CLaA, and which applies the voltage supplied through the outer rim wiring part CT1A, to the thin film resistor 143a. Further, the electrode part T2aA is a part which is made of, for example, a highly conductive metal similar to the electrode part T1aA, which is electrically connected with the other end part of the thin film resistor 143a, the outer rim wiring part CT2A illustrated in FIG. 14B and wiring part CLbA, and which, for example, grounds the other end part of the thin film resistor 143a through the outer rim wiring part CT2A.

The electrode part T1bA is also a part which is made of, for example, a highly conductive metal, which is electrically connected with one end part of the thin film resistor 143b and wiring part CLaA, and which applies the voltage supplied through the outer rim wiring part CT1A, to the thin film resistor 143b. Further, the electrode part T2bA is a part which is made of, for example, a highly conductive metal similar to the electrode part T1bA, which is electrically connected with the other end part of the thin film resistor 143b and the wiring part CLbA, and which, for example, grounds the other end part of the thin film resistor 143b.

By electrically connecting the thin film resistors 143a and 143b in parallel with two electrodes T1aA and T2aA and applying the voltage between the electrodes T1aA and T2aA, the current flows between the thin film resistors 143a and 143b and the thin film resistors 143a and 143b generate heat by Joule heat.

As illustrated in FIG. 13D, the second insulation layer 144 is made of a non-conductive material, and has the same shape as the first insulation layer 142. This second insulation layer 144 is formed across, for example, the upper surface of the first insulation layer 142 (the surface on the +Z side) and the entire area of the heater layer 143. Therefore, the second insulation layer 144 insulates the heater layer 143 in cooperation with the first insulation layer 142, and transmits heat generated by the heater layer 143 to the displacing element layer 145 illustrated in FIG. 13E. The second insulation layer 144 has a film frame part F144 formed on the upper surface of the frame part F142, and beam parts 144a and 144b formed on respective upper surfaces of the beam parts 142a and 142b.

The second insulation layer 144 is preferably a material which has insulation property and good thermal conductivity, and is formed by forming a film by, for example, spattering aluminum nitride (AlN) or alumina (Al2O3).

As illustrated in FIG. 13E, the displacing element layer 145 has two displacing elements 145a and 145b.

The displacing elements 145a and 145b are formed with thin film elements (shape memory alloy) which deform according to the rise in the temperature. Note that, the displacing elements 145a and 145b are formed by, for example, forming a film by spattering, or by bonding by an adhesive etc or bonding by pressure the elements extended thinly in a foil shape. Note that, the film forming method may be plating, depositing, or the like.

Note that, assume that thermal processing (memorizing thermal processing) for memorizing a shape which warps in a concave shape in the +Z direction upon heating is adequately applied to the displacing element 145a and 145b.

Here, the operations of the actuators 14a and 14b will be described referring to the operation of the actuator 14a as an example.

Figure 14C:
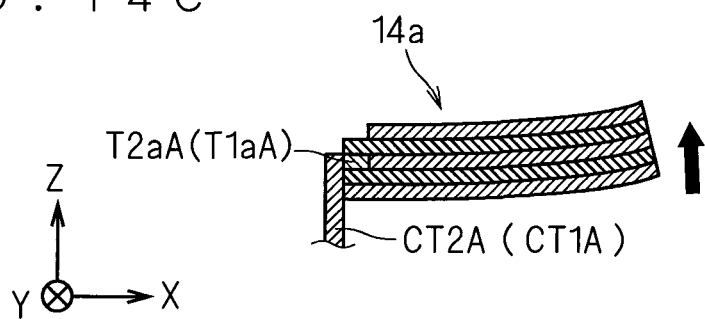

FIGS. 14A to 14C are views for describing the operation of the actuator 14a. FIG. 14A is a plan view illustrating the configuration of the actuator layer 14 similar to FIG. 11, and FIGS. 14B and 14C are schematic sectional views focusing on the actuator 14a seen from a cross-sectional line 6A-6A of FIG. 14A.

By applying the voltage between the electrodes T1aA and T2aA through the outer rim wiring parts CT1A and CT2A disposed from the image capturing element layer 11 to the actuator layer 14 along the outer rims of the image capturing element holder layer 12 and infrared cut filter layer 13, the current flows to the thin film resistor 143a and the thin film resistor 143a generates heat by Joule heat.

FIG. 14B illustrates a state (initial state) where the actuator 14a is not deformed. In the initial state, the voltage is not applied between the electrodes T1aA and T2aA, and the thin film resistor 143a of the heater layer 143 is at a normal temperature. Therefore, the elastic force of the beam part 141a of the base layer 141 makes the actuator 14a show virtually a flat shape.

When the voltage is applied between the electrodes T1aA and T2aA in the initial state illustrated in FIG. 14B, the current flows to the thin film resistor 143a and the thin film resistor 143a is heated by Joule heat. The generated heat is transmitted to the displacing element 145a through the second insulation layer 144a, and the displacing element 145a is deformed to warp in a concave shape in the +Z direction when a predetermined deformation start temperature is exceeded.

Further, when application of the voltage to the electrodes T1aA and T2aA is finished, natural cooling stops deformation of the displacing element 145a warping in a concave shape in the +Z direction and the elastic force of the beam part 141a of the base layer 141 restores the displacing element 145a to the initial state which is not deformed. Thus, the actuator 14a functions as a driver which generates the driving force by being applied the electric field and deforming such that the free tips are displaced with the place contacting the frame part F14 being a fulcrum. Then, the actuator 14a abuts directly or indirectly on a moving target object, and applies an external force to the moving target object and moves this moving target object.

Note that, here, the two thin film resistors 143a and 143b are electrically connected with the electrode parts T1aA, T2aA, T1bA, and T2bA through the wiring parts CLaA and CLbA, and are conducted and heated at the same time. Therefore, the two actuator 14a and 14b are deformed almost likewise at almost the same timing with almost the same mechanism.

The frame part F14 of the actuator layer 14 is bonded to the fixed frame part 151 of the first parallel spring 15 (see FIG. 10). In the bonded state, the free tip FT sides of the actuators 14a and 14b each contact the corresponding projecting parts 161, and displacement produced in the free tips FT of the actuators 14a and 14b is transmitted to the lens layer 16 through each projecting part 161. Thus, the actuators 14a and 14b function as a functioning part which transmits displacement to the lens layer 16.

Note that, the amount displacement produced at the free tips FT sides of the actuators 14a and 14b varies according to the heating temperature of the SMA, and the amount of displacement can be adjusted by controlling the amount of conduction with the heater layer 143.

Further, although the heater layer 143 is deformed accompanying the deformation of the SMA, the electrical resistance of the heater layer 143 changes accompanying this deformation. Therefore, the amount of displacement may be controlled by monitoring the electrical resistance value of the heater layer 143.

That is, these displacing elements 145a and 145b function as a film element which can deform reversibly according to a drive signal, and can move the lens layer 16 by means of deformation of this film element.

Second Parallel Spring 17:

As illustrated in FIG. 9, the second parallel spring 17 is an elastic member which has the same configuration and function as the first parallel spring 15, and has a fixed frame part 171 and an elastic part 172.

The fixed frame part 171 of the second parallel spring 17 is bonded to the cover 20, and a bonding part PG2 provided in the elastic part 172 is bonded to the other principal plane of the lens layer 16.

By this means, when the lens layer 16 and cover 20 are detached, the plate member EB elastically deforms and the second parallel spring 17 functions as a spring mechanism.

Cover 20:

The cover 20 is molded by press working using a mold by using a resin material as a material. The cover 20 protects the driving mechanism KB and serves as a fixing part with respect to the driven body (lens layer 16).

Note that, a plurality of the covers 20 molded in a grid pattern in a resin material are each subjected to dicing for each one of the camera modules 500A.

<Manufacturing Steps of Camera Modules 500A>

Here, manufacturing steps of the camera modules 500A will be described in detail.

Figure 15:
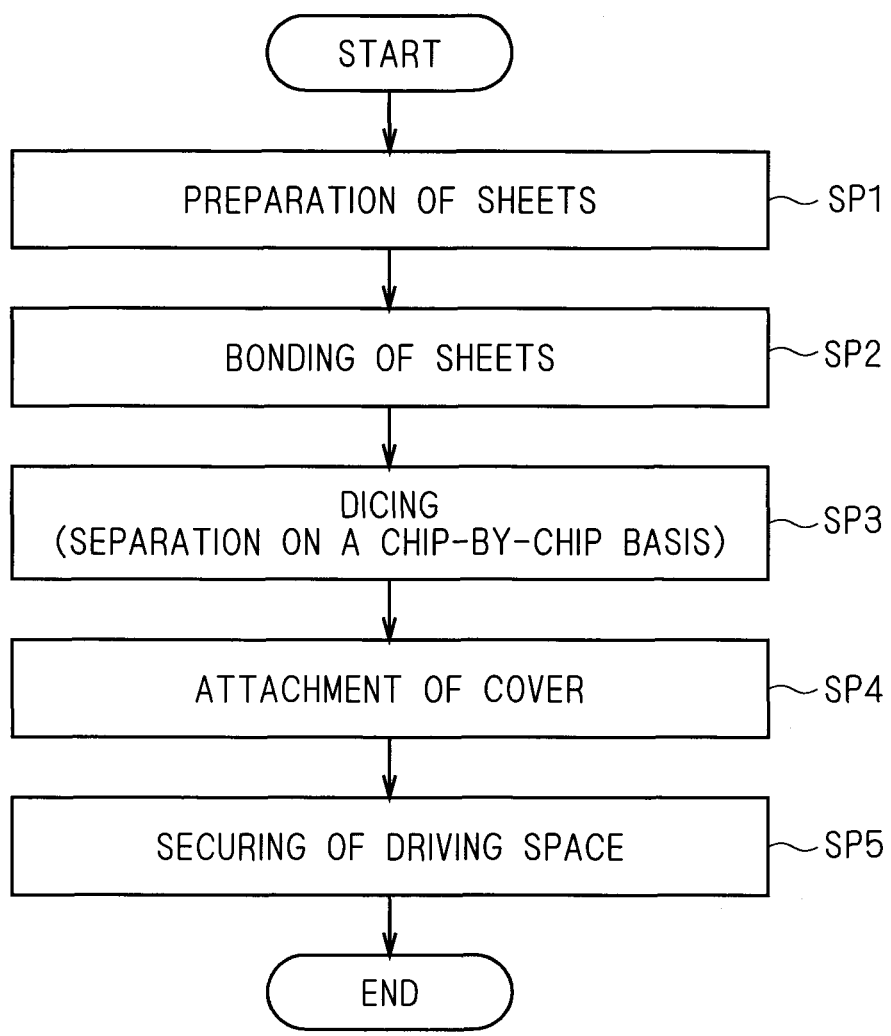
FIG. 15 is a flowchart illustrating manufacturing steps of the camera modules.

FIG. 15 is a flowchart illustrating the manufacturing steps of the camera modules 500A. As illustrated in FIG. 15, (step A) preparation of sheets (step SP1), (step B) bonding of sheets (step SP2), (step C) dicing (step SP3), (step D) attachment of the cover 20 (step SP4) and (step E) securing of driving space (step SP5) are performed sequentially to manufacture the camera modules 500A. Each step will be described below.

Figure 16:
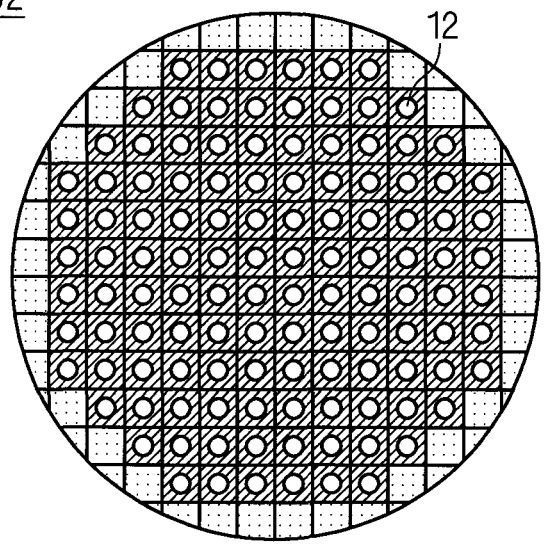
FIG. 16 is a plan view illustrating a configuration example of sheets to be prepared.

Preparation of Sheets (Step A):

First, in step SP1, sheets related to each function layer forming the camera module 500A is formed per layer. FIG. 16 is a plan view illustrating a configuration of sheets to be prepared. Note that, here, the disc-shaped sheets are prepared.

In a sheet of each function layer, multiple chips corresponding to a member related to each function layer are formed in a matrix state in predetermined alignment.

For example, as illustrated in FIG. 16, in the sheet (image capturing element holder sheet) HU2 of the image capturing element holder layer 12, multiple chips corresponding to the image capturing element holder layer 12 are formed in predetermined alignment. Note that, here, the phrase "predetermined alignment" is used to include a state where multiple chips are aligned in a predetermined direction at a predetermined interval.

The image capturing element holder sheet HU2 is made by, for example, press working using a metal mold by using a resin material as a material.

Next, a sheet HU4 of the actuator layer 14 will be described.

First, by adequately etching a silicon (or metal) thin plate, a base plate is formed in which multiple base layers 141 (FIG. 13A) are formed in predetermined alignment (here, predetermined alignment in a matrix state). Note that, instead of a silicon thin plate (silicon substrate), the base layers 141 may be formed with a thin plate made of polyimide and the like.

Next, the insulation film is formed on the base plate using, for example, a photolithographic method or thermal oxidation method, and the first insulation layer 142 (FIG. 13B) is formed on each base layer 141. Next, the heater layer 143 (FIG. 13C) is formed using, for example a spattering method (or depositing method). At this time, on each first insulation layer 142, the thin film resistors 143a and 143b, electrode parts T1aA, T2aA, T1bA, and T2bA and wiring parts CLaA and CLbA are formed.

Note that, the electrode parts T1aA and T2aA are preferably subjected to dicing and then formed in the positions reaching the periphery parts of individual actuator layers.

Next, the second insulation layer 144 (FIG. 13D) is formed by forming a thin film which has insulation property and, preferably, good thermal conductivity, by using, for example, the spattering method (or depositing method).

Next, the displacing element layer 145 (FIG. 13E) is formed using, for example, the spattering method (or depositing method). At this time, the displacing elements 145a and 145b are formed. Then, the actuators 14a and 14b are set in a mold of a shape which needs to be memorized, and are subjected to heating processing (shape memorizing processing) at a predetermined temperature (for example, 600° C.).

In this way, in step SP1, similar to the image capturing element holder sheet HU2, each of the sheets HU1 and HU3 to HU7 including chips related to each function layer of the image capturing element layer 11, infrared cut filter layer 13, actuator layer 14, first parallel spring 15, lens layer 16, and second parallel spring 17 is prepared.

Bonding of Sheets (Step B):

In step SP2, each of the sheets HU1 to HU7 is bonded. FIG. 17 is a view schematically illustrating how the prepared sheets HU1 to HU7 are sequentially laminated and bonded.

More specifically, as illustrated in FIG. 17, the positions of the image capturing element sheet HU1, image capturing element holder sheet HU2, infrared cut filter sheet HU3, actuator sheet HU4, first parallel spring sheet HU5, lens sheet HU6 and second parallel spring sheet HU7 are adjusted (aligned) keeping sheet shapes as is such that each chip included in each of the sheets HU1 to HU7 is laminated on each other. Then, each of the sheets HU1 to HU7 is bonded using, for example, an adhesive.

Figure 18:
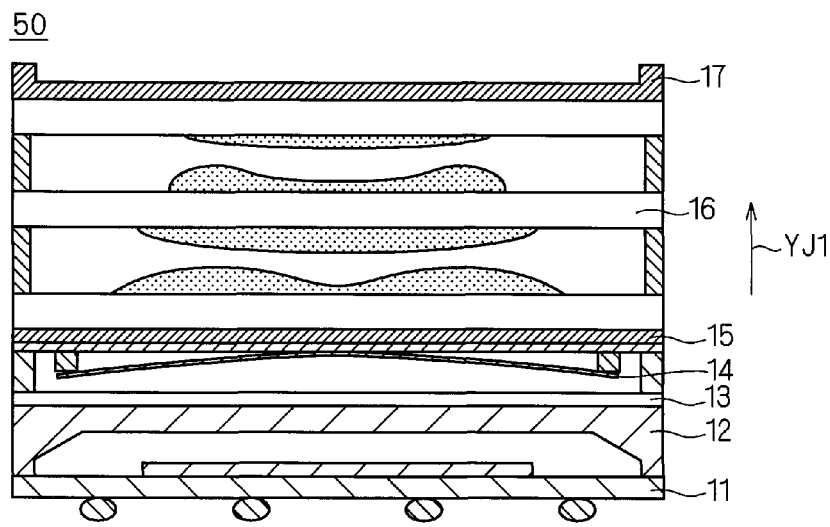
FIG. 18 is a schematic sectional view of an optical unit.

Dicing (Step C):

In next step SP3, a laminated member formed by laminating the seven sheets HU1 to HU7 is protected by a dicing tape and the like and then is detached per chip by the dicing apparatus. By this means, multiple optical system units (optical unit) 50 each having the seven laminated layers 11 to 17 illustrated in FIG. 18 are made.

Next, by printing a paste of a conductive material such as silver or silver palladium in the lateral surfaces of the actuator layer 14, the infrared cut filter layer 13 and the image capturing sensor holder layer 12, the outer rim electrode parts CT1A and CT2A are formed. At this time, one end of the outer rim electrode part CT1A is electrically connected with the electrode pad T11a (FIG. 4 and FIG. 5) formed on one surface of the image capturing element layer 11, and the other end is electrically connected with the electrode T1aA provided in the heater layer 143 in the actuator layer 14. Further, one end of the outer rim electrode part CT2A is electrically connected with the electrode pad T11b (FIG. 4 and FIG. 5) formed on one surface of the image capturing element layer 11, and the other end is electrically connected with the electrode T2aA provided in the heater layer 143 in the actuator layer 14.

With this outer rim electrode part forming method, each layer which is a target in which outer rim electrode parts are formed is shaped and laminated and then forms the outer rim electrode parts, so that it is possible to readily make each layer to be arranged between an image capturing element layer and actuator layer in a compact imaging device formed as a laminated structure at a wafer level.

Figure 19:
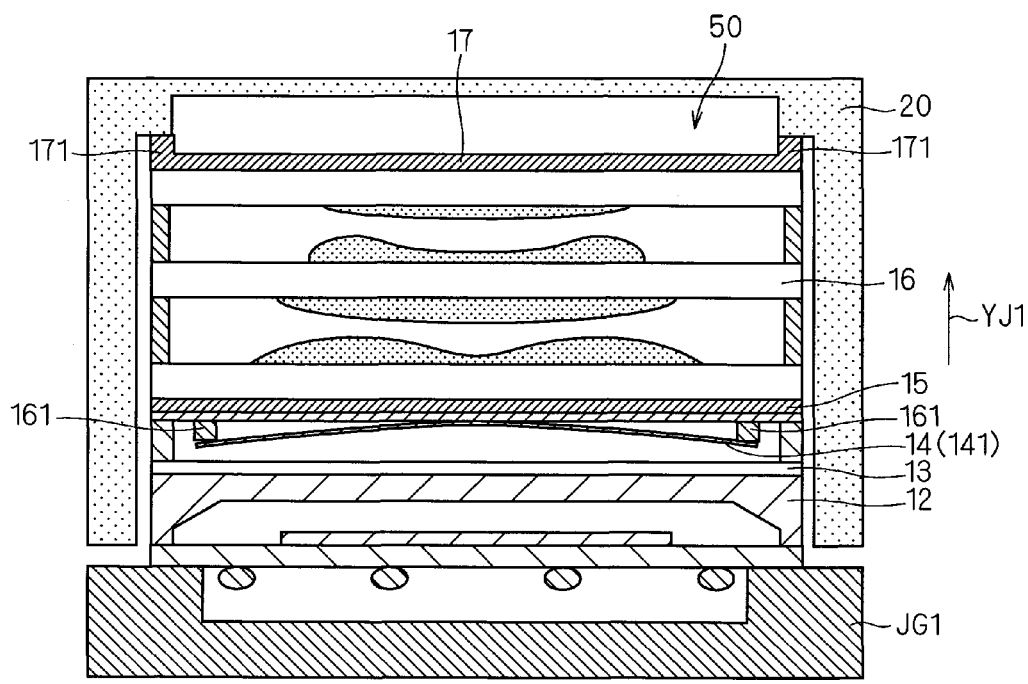
FIG. 19 is a view illustrating the optical unit to which a cover is attached.

Attachment of Cover 20 (Step D):

In step SP4, the cover 20 is attached to the optical unit 50. FIG. 19 is a view illustrating the optical unit 50 to which the cover 20 is attached.

More specifically, as illustrated in FIG. 19, the optical unit 50 is installed on the assembly jig JG1. Then, the cover 20 is placed on the optical unit 50, and the fixed frame part 171 of the second parallel spring 17 and the cover 20 are bonded by, for example, an adhesive.

Note that, the inclination of the plane to install the assembly jig JG1 is preferably within five arc-minutes (1/12 degrees).

Figure 20:
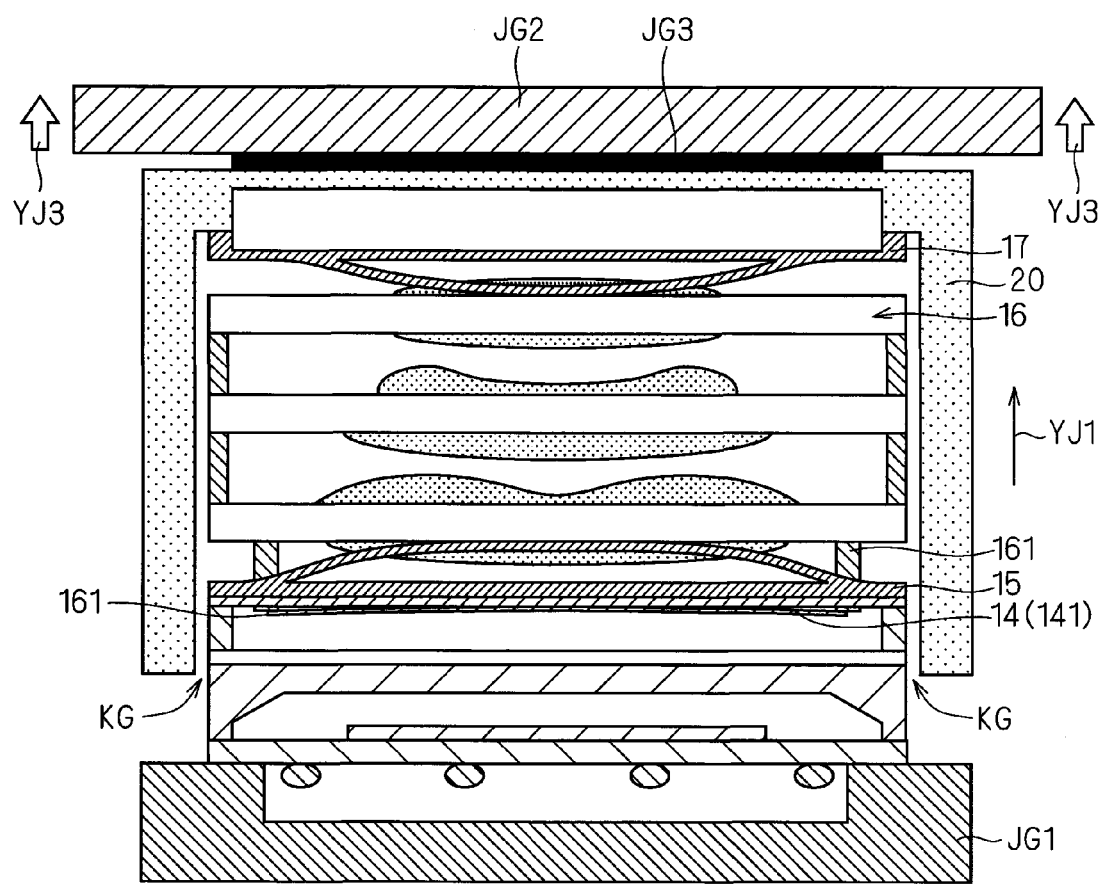
FIG. 20 is a view for describing steps of securing driving space of the lens layer.

Securing of Driving Space (Step E):

In step SP5, driving space of the driven body (lens layer 16) is secured. FIG. 20 is a view for describing steps of securing the driving space of the lens layer 16.

More specifically, as illustrated in FIG. 20, a cover push-up jig JG2 is installed on the upper part of the cover 20. The cover push-up jig JG2 has a vacuum zip part JG3 which can hold the cover 20. Further, the cover push-up jig JG2 provides the push-up precision in units of sub-microns by means of a combination of an AC servo motor and piezoactuator. The cover 20 is pulled up in the +Z direction (direction indicated by an arrow YJ3 in FIG. 20) using this mechanism.

With the present embodiment, the cover 20 is pulled up according to the amount of movement (for example, 200 μm) produced by driving the lens layer 16.

Then, a UV cured resin KJ1 is inserted in a gap KG between the lower part of the cover 20 which is pulled up and the optical unit 50 (see FIG. 3), and the UV cured resin KJ1 is cured by radiation of a ultraviolet ray. This UV cured resin KJ1 is cured, so that the cover 20 and image capturer PB are fixed relatively.

In addition, when the cover 20 is fixed, the inclination of the cover 20 is limited by monitoring the changes in the distance the cover 20 is pulled up and the inclination of the cover 20.

The cover 20 and image capturer PB are detached in the vertical direction of the lens layer 16 by pulling up the cover 20 in this way, and the first parallel spring 15 and second parallel spring 17 are each elastically deformed. Then, the lens layer 16 is made movable in the Z direction.

Thus, in step SP5, the attached cover 20 is pulled up in the +Z direction, so that the driving space of the lens layer 18 is secured.

Further, bending deformation (see FIG. 19) of the actuators 14a and 14b of the actuator layer 14 pushed and bent in the −Z direction by the projecting parts 161 is alleviated by pulling up the cover 20 (see FIG. 20).

In a state where the cover 20 is fixed by the UV cured resin KJ1 (see FIG. 3), the actuators 14a and 14b are preferably have slight bending deformation by being pushed and bent in the −Z direction by the projecting parts 161. In other words, in a state where the cover 20 is fixed, the actuators 14a and 14b are preferably in contact with (abut on) the projecting parts 161.

Although the actuators 14a and 14b of the actuator layer 14 push up the projecting parts 161 in the +Z direction when the lens layer 16 is driven by the focus adjusting operation, a predetermined time is required until the actuators 14a and 14b contact the projecting parts 161 upon driving when, for example, the actuators 14a and 14b and projecting parts 161 are spaced apart in a still state before driving. That is, there is an idling section upon driving.

However, in a state where the cover 20 is fixed, that is, when the actuators 14a and 14b and projecting parts 161 contact each other in advance in a still state before driving, there is no idling section, so that driving displacement produced in the actuators 14a and 14b can be transmitted efficiently to the projecting parts 161.

Thus, the projecting parts 161 function to efficiently transmit driving displacement produced in the actuators 14a and 14b to the lens layer 16 which is the driven body.

MODIFIED EXAMPLE

Although an embodiment of the present invention has been described above, the present invention is not limited to the above-described contents.

Specific Example 1

Figure 21:
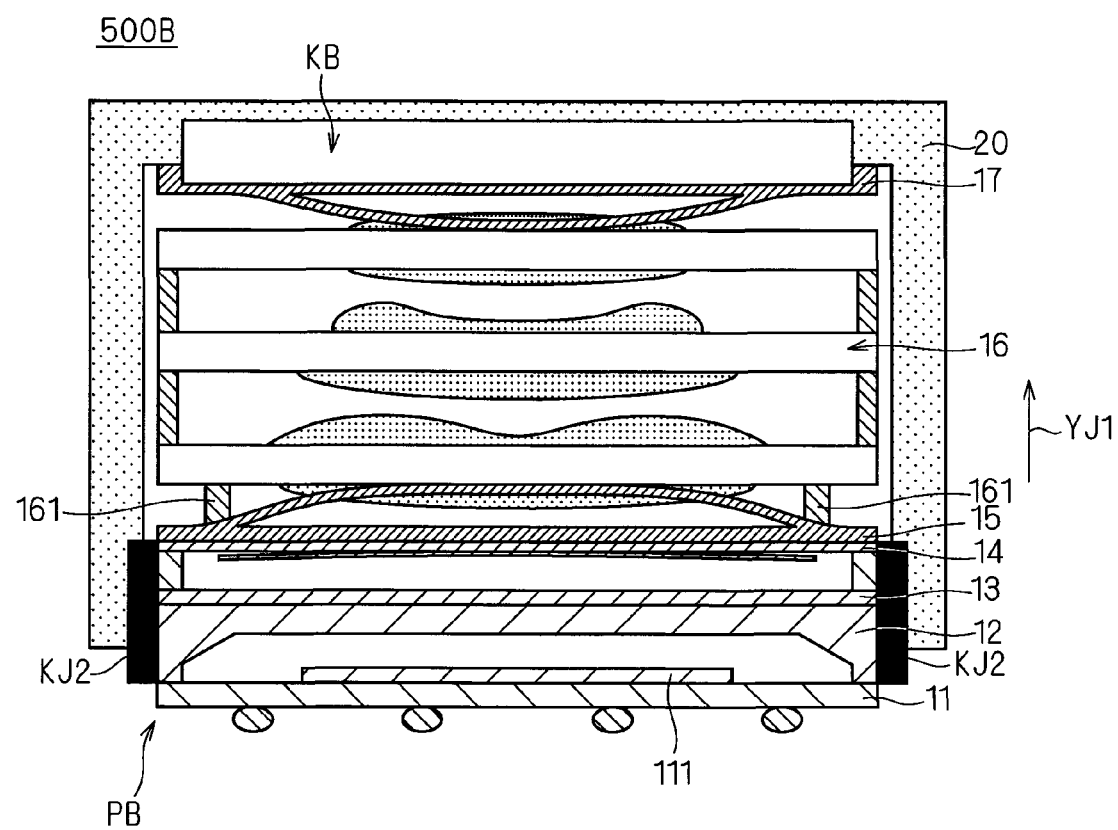
FIG. 21 is a view illustrating a camera module according to a specific example 1 of a modified example.

For example, although, with the above embodiment, electrodes provided in the image capturing element layer 11 are conducted with the heater layer through the thin outer rim wiring parts CT1A and CT2A (FIG. 3) provided on the lateral surfaces of the actuator layer 14, infrared cut filter layer 13 and image capturing element holder layer 12, the present invention is not limited to this. FIG. 21 is a view illustrating a camera module 500B according to the modified example 1.

More specifically, as illustrated in FIG. 21, by making an adhesive KJ2 for filling the gap KG between the cover 20 and optical unit 50 a conductive adhesive, the conductive adhesive may be provided across the lateral surfaces of the actuator layer 14, infrared cut filter layer 13 and image capturing element holder layer 12. This allows the electrodes of the image capturing element layer 11 to conduct with the heater layer through the conductive adhesive. Further, for example, a conductive adhesive and non-conductive adhesive are used in combination as adhesives where necessary to prevent short-circuiting between electrodes of the conductive adhesive corresponding to the outer rim wiring parts CT1A and CT2A.

Further, although the camera module 500A of the above embodiment uses SMA as the displacing elements 145a and 145b, the present invention is not limited to this.

More specifically, as displacing elements which function as film elements which are deformed reversibly according to a drive signal, a thin film (piezoelectric thin film) of a piezoelectric element such as an inorganic piezoelectric body (PZT) or an organic piezoelectric body (PVDF) can be used. When piezoelectric films are used as displacing elements, an electrode, piezoelectric thin film and an electrode are formed on a Si substrate in this order using, for example, the spattering method, and is applied polling using a high electric field.

Specific Example 2

Figure 22:
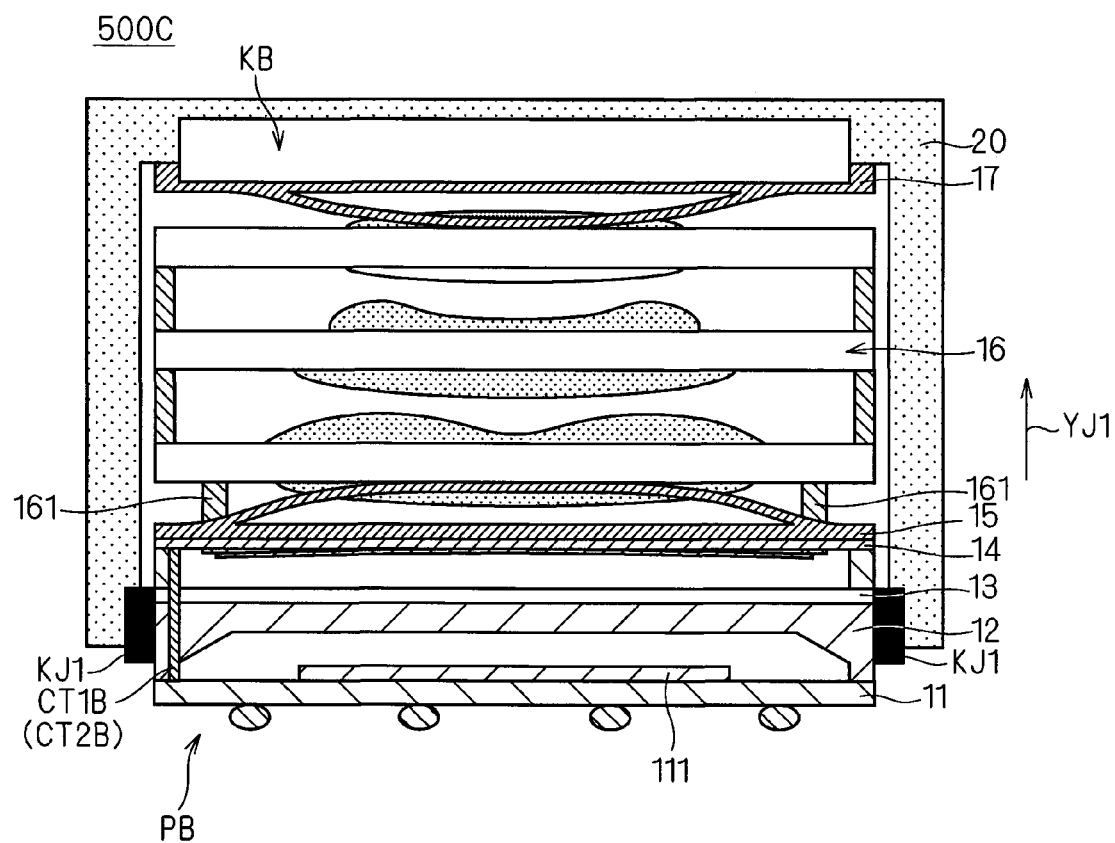
FIG. 22 is a schematic sectional view of a camera module according to a specific example 2 of the modified example.

FIG. 22 is a schematic sectional view illustrating a configuration of a camera module 500C according to a specific example 2 of the modified example.

As illustrated in FIG. 22, the camera module 500C employs the same configuration as the camera module 500A according to the above embodiment except for a penetrating wiring part CT1B (CT2B) disposed between the actuator layer 14 and image capturing element layer 11 and a penetrated hole for forming the penetrating wiring part CT1B (CT2B).

Figure 23A:
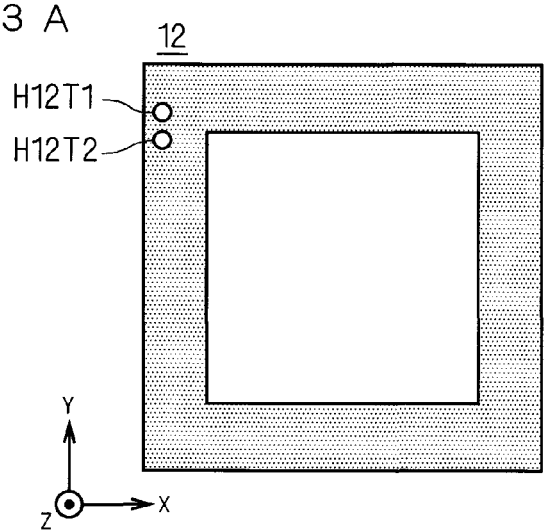
FIGS. 23A to 23C are schematic plan views illustrating an image capturing element holder layer, an infrared cut filter layer, and an actuator layer according to the specific example 2 of the modified example.
Figure 23B:
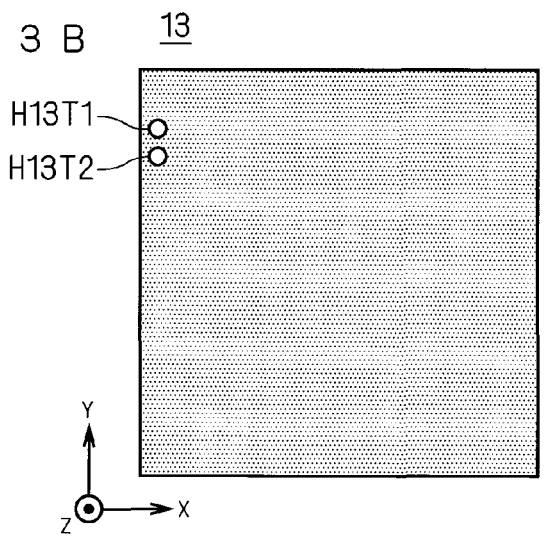
Figure 23C:
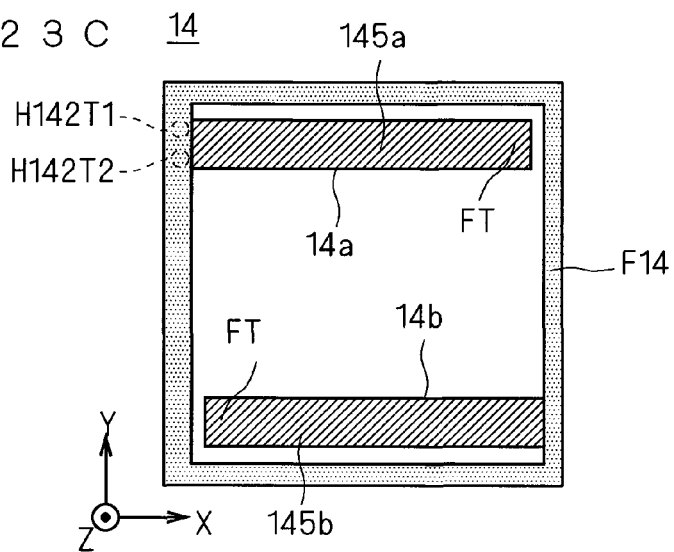

FIGS. 23A to 23C are schematic plan views illustrating an image capturing element holder layer, an infrared cut filter layer and an actuator layer according to the specific example 2.

FIG. 23A illustrates the image capturing element holder layer 12 in which penetrated holes H12T1 and H12T2 are provided in the image capturing element holder layer 12 to form the penetrating wiring part CT1B (CT2B) which transmits a drive signal to be supplied to the actuator layer 14.

FIG. 23B illustrates the infrared cut filter layer 13 in which penetrated holes H13T1 and H13T2 are provided.

Figure 24A:
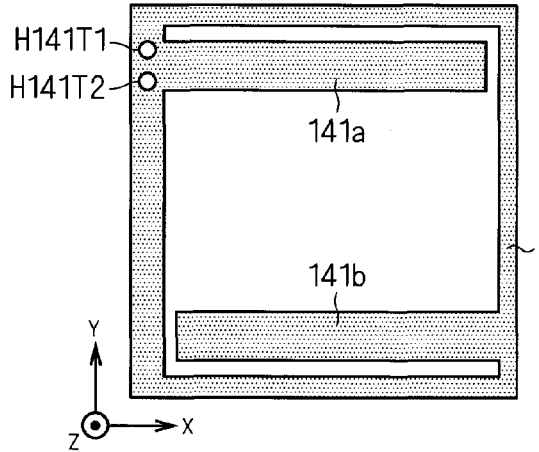
FIGS. 24A to 24E are views for describing a detailed configuration example of the actuator layer according to the specific example 2 of the modified example.
Figure 24D:
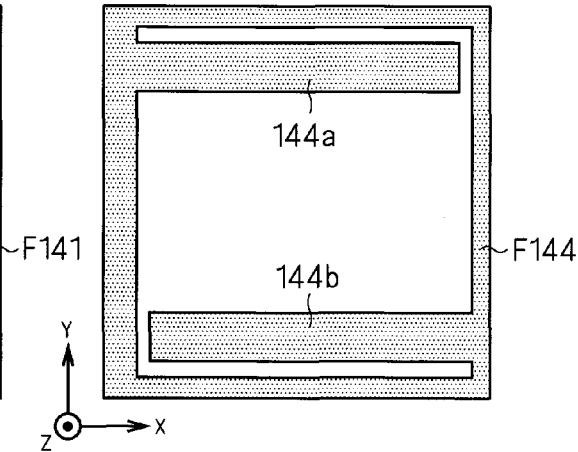
Figure 24B:
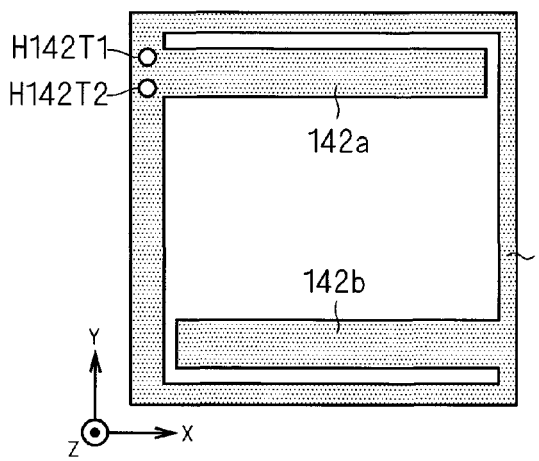
Figure 24E:
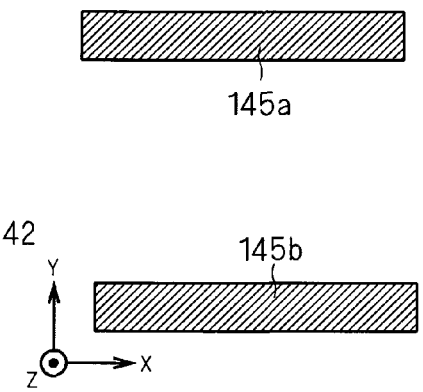

FIG. 23C illustrates the actuator layer 14 having the actuators 14a and 14b which deform by being heated, and FIG. 24B illustrates penetrated holes H142T1 and H142T2.

As illustrated in FIG. 23A, when the image capturing element holder layer 12, infrared cut filter layer 13 and actuator layer 14 are laminated, the penetrated hole H12T1 and penetrated hole H13T1 form one penetrated hole matching the penetrated hole H142T1 provided in the first insulation layer 142, and the penetrated hole H12T2 and penetrated hole H13T2 form one penetrated hole matching the penetrated hole H142T2 provided in the first insulation layer 142.

FIGS. 24A to 24E are views for describing a detailed configuration example of an actuator layer according to the specific example 2 of the modified example.

As illustrated in FIG. 24A, the penetrated hole H141T1 and penetrated hole H141T2 are provided in the base layer 141 of the actuator layer 14, and, as illustrated in FIG. 24B, the penetrated hole H142T1 and penetrated hole H142T2 are provided in the first insulation layer 142 of the actuator layer 14.

Figure 24C:
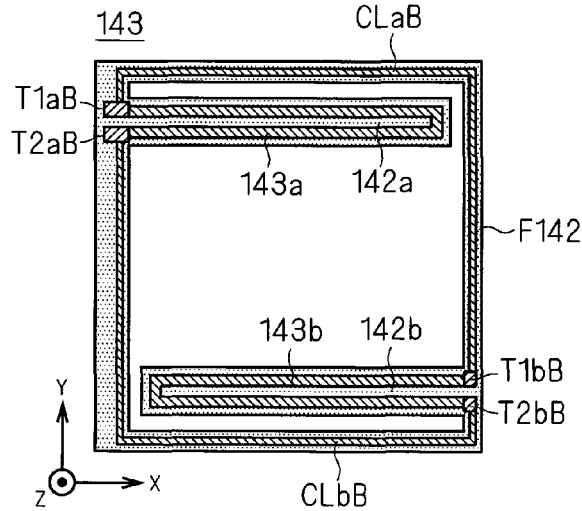

FIG. 24C is a view illustrating a configuration of the heater layer 143 provided on the first insulation layer 142.

Thin film resistors 143a and 143b are heated by conduction, and are formed in a predetermined shape by, for example, spattering using, for example, tantalum nitride (Ta2N) or nichrome (NiCr).

Electrode parts T1aB, T1bB, T2aB and T2bB are made of a conductive material such as gold, and wiring parts CLaB and CLbB are also made of a conductive material such as gold and are formed using photolithography.

The thin film resistors 143a and 143b are electrically connected in parallel to the two electrodes T1aB and T2aB. By applying the voltage between the electrodes T1aB and T2aB, the current flows to the thin film resistors 143a and 143b, and the thin film resistors 143a and 143b generate heat with Joule heat to heat the displacing elements 145a and 145b illustrated in FIG. 24E through the second insulation layer 144 illustrated in FIG. 24D.

As illustrated in FIG. 24A, FIG. 24B and FIG. 24C, when the base layer 141, first insulation layer 142 and heater layer 143 of the actuator layer 14 are laminated, the penetrated hole H141T1 and penetrated hole H142T1 form one penetrated hole matching the electrode part T1aB provided in the heater layer 143, and the penetrated hole H141T2 and penetrated hole H142T2 form one penetrated hole matching the electrode part T2aB provided in the heater layer 143.

Hence, the penetrated hole H12T1, penetrated hole H13T1, penetrated hole H141T1 and penetrated hole H142T1 form one penetrated hole matching the electrode part T1aB, and the penetrated hole H12T2, penetrated hole H13T2, penetrated hole H141T2 and penetrated hole H142T2 form one penetrated hole matching the electrode part T2aB. Here, to form these penetrated holes, after target layers are laminated using femtosecond laser, excimer laser or ion etching method, penetrated holes of several 10 micrometers are made in corner parts of the layers. Further, as a method of forming penetrated holes, a method is possible of making holes in penetrated hole parts in advance when each layer is shaped.

For example, a shadow mask is applied to the part except for these penetrated holes to enable electrical conduction in a vertical direction in the penetrated holes according to gold plating. For example, by filling a conductive material such as gold in the penetrated holes, the penetrating wiring parts CT1B and CT2B are formed.

FIGS. 25A to 25B are schematic sectional views of the actuator layer 14 according to the specific example 2 of the modified example.

The one ends of the penetrating wiring parts CT1B and CT2B are each electrically connected with the electrode parts T1aB and T2aB of the heater layer 143. Further, the other ends of the penetrating wiring parts CT1B and CT2B are electrically connected with the electrode pads T11a and T11b (FIG. 4 and FIG. 5) formed on the surface on the other principal plane side of the image capturing element layer 11 (on the surface in the +Z direction).

As described above, the camera module 500C illustrated in FIG. 22 improves the flexibility to dispose wirings by adopting the penetrating wiring system, and can readily and precisely form penetrating wiring parts (signal transmitters) disposed between the actuator layer and image capturing element layer penetrating through the image capturing element holder layer and infrared cut filter layer, in a compact image capturing element which is made as a laminated structure at a wafer level, according to a method of forming the penetrating wiring parts by making penetrated holes penetrating each layer after each layer of the wiring target is laminated or a method of making holes in advance in penetrated hole parts when each layer of the wiring target is shaped and forming penetrated wiring parts after each layer is laminated. Further, by applying an electric field to a movable part through the penetrated wiring parts (signal transmitters) formed readily and precisely, it is possible to drive the lens in a compact imaging device which is made as a laminated structure at a wafer level.

Specific Example 3

Figure 26:
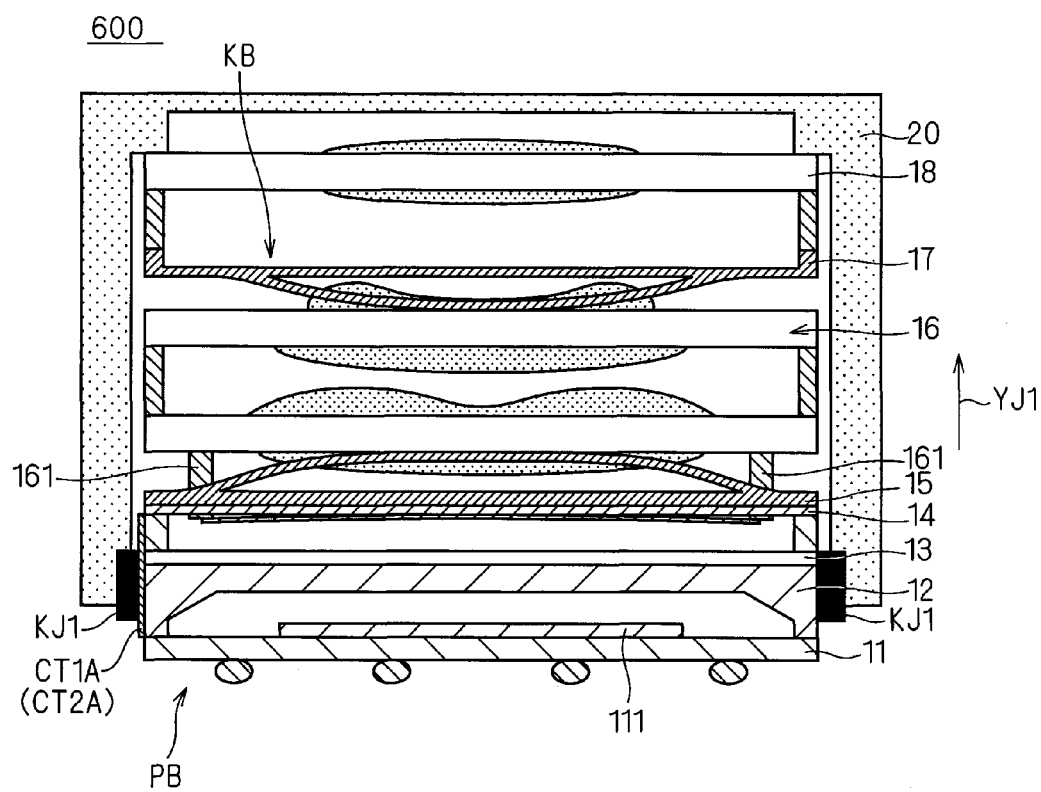
FIG. 26 is a schematic sectional view of a camera module according to a specific example 3 of the modified example.

FIG. 26 is a schematic sectional view illustrating a configuration of a camera module 600 according to a specific example 3 where the direction indicated by an arrow YJ1 is the +Z direction.

As illustrated in FIG. 26, the camera module 600 has the fixed lens layer 18 as the photo-taking optical system, the driving mechanism KB which drives the lens layer 16 as the photo-taking optical system, and the image capturer PB which acquires an image captured from the object image.

The image capturer PB employs a configuration in which, for example, the image capturing element layer 11 having the image capturing element 111 such as a COMS sensor or a CCD sensor, the image capturing element holder layer 12 and the infrared (IR) cut filter layer 13 are laminated in this order.

The fixed lens layer 18 is fixed to the −Z direction surface of the cover 20 between the cover 20 and lens layer 16 and forms one photo-taking optical system in cooperation with the movable lens layer 16.

With the camera module 600, although the fixed lens layer 18 forms one lens group, the fixed lens layer 18 may be formed with a plurality of lens groups to contribute to improving performance of the photo-taking optical system by, for example, decreasing the aberration.

Stored in the space covered by the image capturer PB and cover 20 are the fixed lens layer 18, movable lens layer 16, first parallel spring (lower layer parallel spring) 15 and second parallel spring (upper layer parallel spring) 17 which hold the lens layer 16, and actuator layer (driving layer) 14 which functions as a driver, all of which are made in the wafer state (at a wafer level). The respective function layers stored in this space form the driving mechanism KB which drives the lens layer 16 in cooperation with each other.

More specifically, with the camera module 600, the cover 20, fixed lens layer 18 of the driving mechanism KB and image capturer PB serves as a fixing part for the lens layer 16.

Further, the lens layer 16 is supported by the first parallel spring 15 and second parallel spring 17 bonded to the fixing part. More specifically, the first parallel spring 15 is interposed between the image capturer PB and lens layer 16 on the one principal plane side (−Z side) of the lens layer 16, and the second parallel spring 17 is interposed between the fixed lens layer 18 and lens layer 16 on the other principal plane side (+Z side) of the lens layer 16.

In a non-driven state (for example, a still state before driving), the first parallel spring 15 and second parallel spring 17 are each elastically deformed, and the lens layer 16 rests in a position where the elastic force of the first parallel spring 15 and the elastic force of the second parallel spring 17 balance out.

The actuator layer 14 has an actuator which produces driving displacement in the direction (+Z direction) from the one principal plane side to the other principal plane side of the lens layer 16, and is arranged on one principal plane side of the lens layer 16 and on the other principal plane side of the image capturing element layer 11. That is, the actuator layer 14 is interposed between the image capturing element layer 11 and lens layer 16, and there is no lens element between the actuator layer 14 and image capturing element layer 11. The actuator contacts the projecting parts 161 projecting toward one principal plane side of the lens layer 16, and driving displacement produced in the actuator is transmitted to the lens layer 16 through the projecting parts 161. The outer rim wiring part CT1A (CT2A) is disposed from the image capturing element layer 11 to the actuator layer 14 along the outer rims of the image capturing element holder layer 12 and infrared (IR) cut filter layer 13, and functions as a signal transmitter which transmits a drive signal for driving the actuator.

As described above, the camera module 600 can drive the lens of the photo-taking optical system of high performance while maintaining high reliability, in a compact imaging device which is made as a laminated structure at a wafer level by the photo-taking optical system formed with the fixed lens layer 18 and movable lens layer 16.

EXPLANATION OF SYMBOLS 500A, 500B, 500C, 600 CAMERA MODULE
100 MOBILE TELEPHONE
11 IMAGE CAPTURING ELEMENT LAYER
111 IMAGE CAPTURING ELEMENT
12 IMAGE CAPTURING ELEMENT HOLDER LAYER
13 INFRARED CUT FILTER LAYER
14 ACTUATOR LAYER
141 BASE LAYER
142 FIRST INSULATION LAYER
143 HEATER LAYER
144 SECOND INSULATION LAYER

145 DISPLACING ELEMENT LAYER
14a, 14b ACTUATOR
141a, 141b, 142a, 142b, 144a, 144b BEAM PART
143a, 143b THIN FILM RESISTOR
145a, 145b DISPLACING ELEMENT
15 FIRST PARALLEL SPRING
16 LENS LAYER
161 PROJECTING PART
17 SECOND PARALLEL SPRING
18 FIXED LENS LAYER
20 COVER
LS LAMINATED STRUCTURE
T1aA, T2aA, T1bA, T2bA, T1aB, T2aB, T1bB, T2b ELECTRODE PART
CLaA, CLbA, CLaB, CLbB WIRING PART
CT1B, CT2B PENETRATING WIRING PART
CT1A, CT2A OUTER RIM WIRING PART
C11 PERIPHERAL CIRCUIT
F11 OUTER PERIPHERAL PART
T11a, T11b ELECTRODE PAD
L11a, L11b PENETRATING ELECTRODE

The invention claimed is:

1. An imaging unit comprising:
a laminated structure formed by laminating a plurality of layers including an image capturing element layer having an image capturing element part;
a lens layer configured to change its distance from said image capturing element layer;
an actuator layer between said image capturing element layer and said lens layer and including a movable part configured to move said lens layer; and
a signal transmitter arranged to connect said actuator layer and said image capturing element layer, and configured to transmit a drive signal for driving said movable part from said image capturing element layer side to said actuator layer,
wherein said movable part is deformed in response to said drive signal transmitted through said signal transmitter, said movable part being configured such that the deformation of the movable part actuates movement of said lens layer.

2. The imaging unit according to claim 1, wherein said laminated structure further comprises another lens layer arranged on an opposite side of said image capturing element layer with respect to said lens layer, with a fixed distance from said image capturing element part.

3. The imaging unit according to claim 1, wherein said laminated structure further comprises one or more function layers provided between said image capturing element layer and said actuator layer, and said signal transmitter penetrates through said function layers.

4. The imaging unit according to claim 1, wherein the laminated structure further comprises one or more function layers provided between said image capturing element layer and said actuator layer, and said signal transmitter is disposed along outer rims of said function layers.

5. The imaging unit according to claim 1, wherein the movable part comprises a film element deformed in response to said drive signal, and moves said lens layer by deformation of said film element.

6. The imaging unit according to claim 5, wherein said movable part comprises, as said film element, a thin film of a shape memory alloy attached to a substrate.

7. The imaging unit according to claim 5, wherein said movable part comprises, as said film element, a thin film of a piezoelectric element attached to a substrate.

8. An imaging device comprising:
an imaging unit, wherein said imaging unit includes: a laminated structure formed by laminating a plurality of layers including: an image capturing element layer including an image capturing element part;
a lens layer configured to change its distance from said image capturing element layer;
an actuator layer including a movable part configured to move said lens layer; and
a signal transmitter arranged to connect said actuator layer and said image capturing element layer and transmit a drive signal configured to drive said movable part from said image capturing element layer side to said actuator layer, said movable part configured to be deformed in response to said drive signal transmitted through said signal transmitter, said actuator layer is arranged between said image capturing element layer and said lens layer, and said imaging unit is configured to receive a supply of said drive signal to drive said lens layer.

9. An imaging unit comprising:
a laminated structure formed by laminating a plurality of layers including an image capturing element layer having an image capturing element part;
a lens layer configured to change its distance from said image capturing element layer;
an actuator layer between said image capturing element layer and said lens layer and including a movable part configured to move said lens layer; and
a signal transmitter arranged to connect said actuator layer and said image capturing element layer, and configured to transmit a drive signal for driving said movable part from said image capturing element layer side to said actuator layer,
wherein said movable part is deformed in response to said drive signal transmitted through said signal transmitter,
wherein the laminated structure further comprises one or more function layers provided between said image capturing element layer and said actuator layer, and said signal transmitter is disposed along outer rims of said function layers.

10. An imaging unit comprising:
a laminated structure formed by laminating a plurality of layers including an image capturing element layer having an image capturing element part;
a lens layer configured to change its distance from said image capturing element layer;
an actuator layer between said image capturing element layer and said lens layer and including a movable part configured to move said lens layer; and
a signal transmitter arranged to connect said actuator layer and said image capturing element layer, and configured to transmit a drive signal for driving said movable part from said image capturing element layer side to said actuator layer,
wherein said movable part is deformed in response to said drive signal transmitted through said signal transmitter,
wherein the movable part comprises a film element deformed in response to said drive signal, and moves said lens layer by deformation of said film element.

11. The imaging unit according to claim 10, wherein said movable part comprises, as said film element, a thin film of a shape memory alloy attached to a substrate.

12. The imaging unit according to claim 10, wherein said movable part comprises, as said film element, a thin film of a piezoelectric element attached to a substrate.

* * * * *